(12) United States Patent
Kodemura

(10) Patent No.: US 6,472,082 B2
(45) Date of Patent: *Oct. 29, 2002

(54) MODIFIED THERMOPLASTIC NORBORNENE POLYMER AND PROCESS FOR THE PRODUCTION THEREOF

(75) Inventor: Junji Kodemura, Kawasaki (JP)

(73) Assignee: Nippon Zeon Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/297,346

(22) PCT Filed: Oct. 29, 1997

(86) PCT No.: PCT/JP97/03932

§ 371 (c)(1),
(2), (4) Date: Apr. 29, 1999

(87) PCT Pub. No.: WO98/18838

PCT Pub. Date: May 7, 1998

(65) Prior Publication Data

US 2002/0103303 A1 Aug. 1, 2002

(30) Foreign Application Priority Data

Oct. 29, 1996 (JP) .............................................. 8-303728

(51) Int. Cl.$^7$ ........................... C08F 283/14; C08J 5/24
(52) U.S. Cl. ...................... 428/457; 428/461; 428/462; 524/504; 525/242; 525/263; 525/284; 525/285; 525/286
(58) Field of Search ................................. 525/262, 263, 525/242, 284, 285, 286; 524/504; 428/457, 461, 462

(56) References Cited

FOREIGN PATENT DOCUMENTS

| | | |
|---|---|---|
| EP | 0203799 | 12/1986 |
| JP | 50-59488 | 5/1975 |
| JP | 62-27412 | 2/1987 |
| JP | 62-34924 | 2/1987 |
| JP | 2-227424 | 9/1990 |
| JP | 2-276842 | 11/1990 |
| JP | 3-14882 | 1/1991 |
| JP | 3-122137 | 5/1991 |
| JP | 5-51421 | 3/1993 |
| JP | 6-248164 | 9/1994 |
| JP | 7-188396 | 7/1995 |
| JP | 7-196779 | 8/1995 |
| JP | 7-226302 | 8/1995 |
| JP | 8-20692 | 1/1996 |
| JP | 8-259784 | 10/1996 |
| JP | 8-332701 | 12/1996 |
| WO | WO8901407 | 2/1989 |

OTHER PUBLICATIONS

Kataoka et al., CAPLUS AN 1996:262, 102.*

* cited by examiner

Primary Examiner—Jeffrey Mullis
(74) Attorney, Agent, or Firm—Dinsmore & Shohl LLP

(57) ABSTRACT

A modified thermoplastic norbornene polymer obtained by graft-modifying a thermoplastic norbornene polymer selected from a ring-opening polymer of a norbornene monomer or a hydrogenated product thereof with at least one unsaturated compound selected from the group consisting of unsaturated epoxy compounds and unsaturated carboxylic compounds, and having a rate of graft modification of at least 10 mol % and a number average molecular weight (Mn) of 500 to 500,000, a production process thereof, and a crosslinking polymer composition comprising the modified thermoplastic norbornene polymer and a crosslinking agent.

14 Claims, No Drawings

MODIFIED THERMOPLASTIC NORBORNENE POLYMER AND PROCESS FOR THE PRODUCTION THEREOF

TECHNICAL FIELD

The present invention relates to modified thermoplastic norbornene polymers obtained by graft-modifying a ring-opening polymer of a norbornene monomer or a hydrogenated product thereof with an unsaturated epoxy compound or unsaturated carboxylic compound, and a production process thereof, and more particularly to modified thermoplastic norbornene polymers which are excellent in electrical properties such as dielectric constant, adhesion property to other materials such as metals (metal foils, metallic wirings, etc.) and silicon wafers, heat resistance, moisture resistance, etc., can be prepared into high-concentration solutions, and are also excellent in the ability to uniformly disperse various kinds of compounding additives in such a solution, and a production process thereof.

The modified thermoplastic norbornene polymers according to the present invention are suitable for use in electrical and electronic fields as impregnating resins for prepregs, sheets, interlayer insulating films and the like making good use of these excellent various properties

BACKGROUND ART

With the rapid advancement of advanced information-oriented society in recent years, there is a strong demand for the speeding up of information processing and the miniaturization of apparatus or devices in a field of the electronic industry. In electronic parts used in electrical apparatus and electronic equipment, such as semiconductors, ICs, hybrid ICs, printed boards, display devices and display parts, insulating materials having a sufficiently low dielectric constant in a high-frequency region are required for purpose of realizing the speeding up and miniaturization in the high-frequency region. In order to ensure high reliability over a long period of time, insulating materials also excellent in heat resistance such as soldering heat resistance, and moisture resistance are also required. Further, the speeding up of information processing is pressed in a field of information processing apparatus such as computers and communication apparatus. In addition, their miniaturization and weight saving are required so as to be portable. In keeping with such requirements, it is strongly required of circuits installed in these apparatus to make circuit boards high performance such as multi-layer structure, high precision and minute processing.

In recent years, there has been developed a multi-chip module (MCM) for flip chip packaging, by which miniaturized and high-density packaging has been realized. In order to ensure high reliability over a long period of time, an insulating material used in an interlayer insulating film for this MCM is required to have, in addition to the above required properties, sufficient adhesion property to substrates such as silicon wafers, and conducting layers such as metal layers (metal foils, metallized films, etc.), since MCM is fabricated by laying many insulating layers and conductive layers on one another on a substrate such as a silicon wafer. In addition, since to be able to make a via diameter small by reduction in wiring pitch is require of MCM, it is required to impart photosensitivity to the insulating material in order to make minute processing possible.

As insulating materials for MCM, there have heretofore been investigated materials obtained by imparting photosensitivity to a polyimide resin or epoxy resin. However, the conventional photosensitive polyimide resins are insufficient in electrical properties such as dielectric constant in a high-frequency region and also in moisture resistance and hence have involved a drawback that it is difficult to cope with the achievement of high reliability over a long period of time. In the epoxy resins, it has been attempted to introduce a photosensitive group such as an allyl group therein to impart photosensitivity to the resins. However, such an attempt has involved a drawback that electrical properties. such as dielectric constant, of the resultant resins are deteriorated to a great extent, and their heat stability also become insufficient.

On the other hand, a circuit board is produced by impregnating a reinforcing base material, for example, a glass cloth, with a resin varnish, drying the varnish to form a sheet (prepreg) in a semi-cured state, laying up a copper foil or outer copper-clad sheet, the prepreg, an inner copper-clad sheet, and the like in that order between mirror plates and then hot-pressing the resultant laminate to completely cure the resin. As a resin material, there has heretofore been used a phenol resin, epoxy resin, polyimide resin, fluororesin, polybutadiene resin or the like.

However, the dielectric constant of thermosetting resins such as the phenol resin, epoxy resin and polyimide resin is generally as high as at least 4.0, and so their electrical properties are insufficient. Therefore, circuit boards making use of these thermosetting resins have been difficult to achieve the speeding up and high reliability of arithmetic processing. On the other hand, circuit boards making use of thermoplastic resins such as the fluororesins and polybutadiene resins are poor in heat resistance and so may cause cracking and/or delamination in some cases upon soldering or the like. In addition, such resins have also been difficult to form a multi-layer structure due to their poor dimensional stability.

Accordingly, in recent years, it has been proposed to use thermoplastic norbornene resins as insulating materials.

For example, Japanese Patent Application Laid-Open No. 34924/1987 discloses a process comprising synthesizing a norbornene resin having an intrinsic viscosity [η] of 1.15 to 2.22 as measured at 135° C. in decalin by addition polymerization of a norbornene type cycloolefin and ethylene, kneading the norbornene resin and a crosslinking aid, grinding the resultant mixture, impregnating the ground mixture with a solution of an organic peroxide, removing the solution and then press molding it to crosslink the resin.

However, this process has involved problems that the process is complicated, and besides it is difficult to prepare a high-concentration solution of the norbornene resin, and the organic peroxide and other compounding additives are not uniformly dispersed. Accordingly, it is necessary to prepare a low-concentration solution in order to produce a prepreg using a solution of the resin obtained by this process. When the reinforcing base material is impregnated with the low-concentration solution, however, it takes a long time to dry the solution until it becomes tack-free at room temperature, and so the base material must be left at rest so as not to deform in the meantime. Therefore, this process involves a problem of poor productivity. In addition, various kinds of compounding additives must be added according to various uses. However, such compounding additives cannot be uniformly dispersed in the resin solution due to the high viscosity of the solution, and there is also an disadvantage that the resin solution and the compounding additives undergo phase separation from each other according to the kinds and compounding amounts of the compounding additives used. If the reinforcing base material is impregnated with the solution phase-separated into 2 phases, any prepreg in which the individual components are uniformly dispersed cannot be obtained. In addition, if a copper foil is laminated on the thus-obtained molding such as the prepreg, the resultant laminate has no sufficient peel strength and hence involves a problem of durability.

Japanese Patent Application Laid-Open No. 248164/1994 discloses a process in which a hydrogenated thermoplastic ring-opening norbornene resin, an organic peroxide, a crosslinking aid and a flame retardant such as brominated bisphenol are dispersed in a solvent, and casting is conducted using the resultant solution, or a reinforcing base material is impregnated with the solution, and the solvent is then removed to crosslinking the resin by heating, thereby producing a sheet, prepreg or the like. When the norbornene resin specifically disclosed in this publication is used, however, it is difficult to make a solids concentration sufficiently high, and so productivity in a drying step becomes insufficient. In addition, such a process has involved a problem that such a sheet or prepreg cannot be fully applied according to use fields, since the kinds and amounts of compounding additives which can be uniformly dispersed are limited, and moreover its peel strength to a copper film is insufficient.

Japanese Patent Application Laid-Open No. 27412/1987 has proposed modified cycloolefin copolymers obtained by grafting an unsaturated epoxy compound such as allyl glycidyl ether on an addition copolymer of ethylene and a norbornene monomer. Japanese Patent Application Laid-Open No. 20692/1996 has proposed resin compositions comprising a cycloolefin resin having a carboxylic acid derivative type residue and a heat-crosslinking agent and/or a photo-crosslinking agent. Japanese Patent Application Laid-Open No. 259784/1996 has proposed resin compositions comprising an epoxy group-containing cycloolefin resin and a crosslinking agent. All of these resin materials have been reported to be excellent in electrical properties, heat resistance, adhesion property, etc.

However, the modified polymers specifically disclosed in these prior art documents are all insufficient in the rate of graft modification. Therefore, they are insufficient in adhesion property to other materials such as metals and silicon wafers and moreover in heat resistance, and thus have involved a problem that deformation and cracking tend to occur in a solder reflowing step or a sputtering step.

DISCLOSURE OF THE INVENTION

It is an object of the present invention to provide modified thermoplastic norbornene polymers which are excellent in electrical properties such as dielectric constant in a high-frequency region, heat resistance, moisture resistance and heat stability and also in adhesion property to other materials such as metals and silicon wafers, and a production process thereof.

Another object of the present invention is to provide crosslinking polymer compositions comprising an epoxy group-containing norbornene polymer which is excellent in electrical properties such as dielectric constant in a high-frequency region, heat resistance, moisture resistance and heat stability and also in adhesion property to other materials such as metals and silicon wafers, and is also suitable for compounding of a crosslinking agent.

A further object of the present invention is to provide modified thermoplastic norbornene polymers which are excellent in heat resistance, electrical properties such as dielectric constant, and peel strength to metal foils, can be prepared into high-concentration solutions, and are also excellent in the ability to uniformly disperse various kinds of compounding additives in such a solution, a production process thereof, and crosslinking polymer compositions comprising such a modified thermoplastic norbornene polymer and a crosslinking agent.

The present inventor has carried out an extensive investigation with a view toward overcoming the above-described problems involved in the prior art. As a result, it has been found that the above objects can be achieved by graft-modifying a ring-opening polymer of a norbornene monomer, which has a molecular weight within a specific range, or a hydrogenated product thereof with at least one unsaturated compound selected from the group consisting of unsaturated epoxy compounds and unsaturated carboxylic compounds.

Of the modified thermoplastic norbornene polymers according to the present invention, comparatively low-molecular weight polymers having a rate of graft modification of at least 10 mol % and a number average molecular weight (Mn) of 500 to 20,000 can be prepared into high-concentration solutions, and various compounding additives can be uniformly dispersed at a high concentration in such a solution. Since such a solution is excellent in the ability to impregnate reinforcing base materials and also good in film-forming property, prepregs and sheets can be produced by using a crosslinking polymer composition comprising the modified thermoplastic norbornene polymer and a crosslinking agent. In addition, laminates produced from the prepregs or sheets are excellent in heat resistance and dielectric constant, and moreover a laminate excellent in peel strength to a metal layer can be provided when the metal layer is laminated on such a prepreg or sheet.

Of the modified thermoplastic norbornene polymers according to the present invention, comparatively high-molecular weight polymers having a rate of graft modification of at least 10 mol % and a number average molecular weight (Mn) exceeding 20,000 are excellent in electrical properties such as dielectric constant in a high-frequency region, heat resistance, moisture resistance and heat stability, and also in adhesion property to other materials such as metals and silicon wafers. Therefore, such polymers are particularly suitable for use as overcoats, interlayer insulating films and the like.

In addition, various crosslinking methods such as crosslinking by heat and crosslinking by light can be applied to the modified thermoplastic norbornene polymers according to the present invention by selecting the kind of a crosslinking agent used.

The present invention has been led to completion on the basis of these findings.

According to the present invention, there is thus provided a modified thermoplastic norbornene polymer obtained by graft-modifying a thermoplastic norbornene polymer selected from a ring-opening polymer of a norbornene monomer or a hydrogenated product thereof with at least one unsaturated compound selected from the group consisting of unsaturated epoxy compounds and unsaturated carboxylic compounds, wherein the modified polymer has a rate of graft modification of at least 10 mol % and a number average molecular weight (Mn) of 500 to 500,000.

According to the present invention, there is also provided a process for producing a modified thermoplastic norbornene polymer having a rate of graft modification of at least 10 mol % and a number average molecular weight (Mn) of 500 to 500,000, the process comprising reacting a thermoplastic norbornene polymer selected from a ring-opening polymer of a norbornene monomer or a hydrogenated product thereof and having a number average molecular weight (Mn) of 500 to 500,000 with at least one unsaturated compound selected from the group consisting of unsaturated epoxy compounds and unsaturated carboxylic compounds in the presence of an organic peroxide.

According to the present invention, there is further provided a crosslinking polymer composition comprising a modified thermoplastic norbornene polymer obtained by graft-modifying a thermoplastic norbornene polymer selected from a ring-opening polymer of a norbornene monomer or a hydrogenated product thereof with at least one unsaturated compound selected from the group consisting of unsaturated epoxy compounds and unsaturated carboxylic compounds, and having a rate of graft modification of at least 10 mol % and a number average molecular weight (Mn) of 500 to 500,000, and a crosslinking agent.

BEST MODE FOR CARRYING OUT THE INVENTION

Modified Thermoplastic Norbornene Polymer

The modified thermoplastic norbornene polymers useful in the practice of the present invention are those obtained by graft-modifying a thermoplastic norbornene polymer having a number average molecular weight (Mn) of 500 to 500,000 with at least one unsaturated compound selected from the group consisting of unsaturated epoxy compounds and unsaturated carboxylic compounds.

As the thermoplastic norbornene polymer, is used a ring-opening polymer of a norbornene monomer or a hydrogenated product thereof. The hydrogenated product of the ring-opening polymer of the norbornene monomer is particularly preferred from the viewpoints of heat resistance, durability and electrical properties such as dielectric constant.

(1) Norbornene Monomer:

No particular limitation is imposed on the norbornene monomer, ring-opening polymer of the norbornene monomer, and hydrogenated product thereof used in the present invention. Publicly known monomers and polymers disclosed in, for example, Japanese Patent Application Laid-Open Nos. 14882/1991 and 122137/1991, etc. may be used.

The norbornene monomers are publicly known compounds disclosed in the above-described publications and Japanese Patent Application Laid-Open Nos. 227424/1990 and 276842/1990, etc. Examples thereof include polycyclic hydrocarbons having a norbornene structure; alkyl-, alkenyl-, alkylidene- or aromatic-substituted derivatives thereof; their derivatives substituted by a polar group such as a halogen, hydroxyl group, ester group, alkoxy group, cyano group, amide group, imide group or silyl group; alkyl-, alkenyl, alkylidene- or aromatic-substituted derivatives of the norbornene monomers having such a polar group; etc. Of these, the polycyclic hydrocarbons having a norbornene structure, and alkyl-, alkenyl, alkylidene- or aromatic-substituted derivatives thereof are preferred in that they are particularly excellent in chemical resistance and moisture resistance.

The typical norbornene monomers used in the present invention are compounds represented by the formula (a):

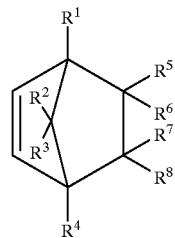

(a)

wherein $R^1$ to $R^8$ are independently a hydrogen atom, hydrocarbon group, halogen atom, alkoxy group, ester group, cyano group, amide group, imide group, silyl group or hydrocarbon group substituted by a polar group (i.e., a halogen atom, alkoxy group, ester group, cyano group, amide group, imide group or silyl group), with the proviso that at least two of $R^5$ to $R^8$ may be bonded to each other to form a monocycle or polycycle, the monocycle or polycycle may have carbon-carbon double bond(s) or be in the form of an aromatic ring, and $R^5$ and $R^6$, or $R^7$ and $R^8$ may form an alkylidene group.

Examples of the halogen atom in the formula (a) include fluorine, chlorine, bromine and iodine atoms. Examples of the hydrocarbon group include alkyl groups having 1 to 20 carbon atoms, preferably 1 to 10 carbon atoms, alkenyl groups having 2 to 20 carbon atoms, preferably 2 to 10 carbon atoms, cycloalkyl groups having 3 to 15 carbon atoms, preferably 3 to 8 carbon atoms, and aryl groups having 6 to 12 carbon atoms, preferably 6 to 8 carbon atoms. Examples of the hydrocarbon group substituted by a polar group include halogenated alkyl groups having 1 to 20 carbon atoms, preferably 1 to 10 carbon atoms. The alkylidene group is preferably not substituted by any polar group, since the moisture resistance of the resulting polymer is highly enhanced. The number of carbon atoms thereof is generally within a range of 1 to 20, preferably 1 to 10.

Specific examples of the alkyl groups include methyl, ethyl, n-propyl, isopropyl, n-butyl, t-butyl, n-amyl, n-hexyl and decyl groups. Specific examples of the alkenyl groups include vinyl, propenyl, butenyl, pentenyl and hexenyl groups. Specific examples of the aromatic groups include phenyl, tolyl, xylyl, biphenyl and naphthyl groups. Specific examples of the alkylidene group include methylidene, ethylidene, propylidene and isopropylidene groups. Examples of the ester group include alkyl ester groups.

In the formula (a), each of $R^1$ to $R^4$ is preferably a hydrogen atom or hydrocarbon group when high moisture resistance is required. At least two of $R^5$ to $R^8$ may be bonded to each other to form-a monocycle or polycycle, and the monocycle or polycycle may have carbon-carbon double bond(s) or be in the form of an aromatic ring. In this case, the monocycle or polycycle may have such a substituent group (hydrocarbon group, polar group or hydrocarbon group substituted by the polar group) as described above. In this case, however, the monocycle or polycycle preferably has no polar group when high moisture resistance is required.

As preferable examples of the norbornene monomers represented by the formula (a), may be mentioned compounds represented by the formula (a1):

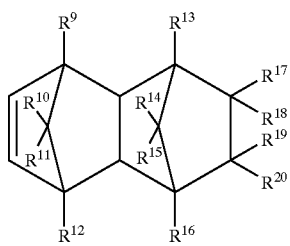

(a1)

In the formula (a1), $R^9$ to $R^{20}$ are independently a hydrogen atom, hydrocarbon group, halogen atom, alkoxy group, ester group (for example, alkyl ester group), cyano group, amide group, imide group, silyl group or hydrocarbon group substituted by a polar group (i.e., a halogen atom, alkoxy group, ester group, cyano group, amide group, imide group or silyl group). When high moisture resistance is required of the resulting polymer, each of these groups is a hydrogen atom or hydrocarbon group. However, at least two of $R^{17}$ to $R^{20}$ may be bonded to each other to form a monocycle or polycycle, and the monocycle or polycycle may have carbon-carbon double bond(s) or be in the form of an aromatic ring. $R^{17}$ and $R^{18}$, or $R^{19}$ and $R^{20}$ may form an alkylidene group. It goes without saying that the monocycle, polycycle or aromatic ring may have such a substituent group (hydrocarbon group, polar group or hydrocarbon group substituted by the polar group) as described above. In this case, however, such a cycle or ring preferably has no polar group when high moisture resistance is required. Specific examples of these substituents are the same as described above.

As other preferable examples of the norbornene monomers represented by the formula (a), may be mentioned compounds represented by the formula (a2):

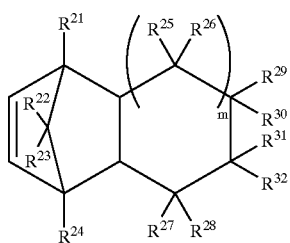

(a2)

In the formula (a2), m is 0, 1 or 2. When m is 0, a cyclopentane ring is formed. $R^{21}$ to $R^{32}$ are independently a hydrogen atom, hydrocarbon group, halogen atom, alkoxy group, ester group (for example, alkyl ester group), cyano group, amide group, imide group, silyl group or hydrocarbon group substituted by a polar group (i.e., a halogen atom, alkoxy group, ester group, cyano group, amide group, imide group or silyl group). When high moisture resistance is required of the resulting polymer, each of these groups is a hydrogen atom or hydrocarbon group. However, at least two of $R^{29}$ to $R^{32}$ may be bonded to each other to form a monocycle or polycycle, and the monocycle or polycycle may have carbon-carbon double bond(s) or be in the form of an aromatic ring. $R^{29}$ and $R^{30}$, or $R^{31}$ and $R^{32}$ may form an alkylidene group, or $R^{30}$ and $R^{31}$ may be bonded to each other to form a double bond between 2 carbon atoms to which $R^{30}$ and $R^{31}$ are bonded, respectively. It goes without saying that the monocycle, polycycle or aromatic ring may have such a substituent group (hydrocarbon group, polar group or hydrocarbon group substituted by the polar group) as described above. In this case, however, such a cycle or ring preferably has no polar group when high moisture resistance is required. Specific examples of these substituents are the same as described above.

Specific examples of the norbornene monomers include bicyclo[2.2.1]hept-2-ene derivatives, tetracyclo-[4.4.0.$1^{2,5}$.$1^{7,10}$]-3-dodecene derivatives, hexacyclo-[6.6.1.$1^{3,6}$.$1^{10,13}$.$0^{2,7}$.$0^{9,14}$]-4-heptadecene derivative octacyclo [8.8.0.$1^{2,9}$.$1^{4,7}$.$1^{11,18}$.$1^{13,16}$.$0^{3,8}$.$0^{12,17}$]-5-docosene derivatives, pentacyclo[6.6.1.$1^{3,6}$.$0^{2,7}$$0^{9,14}$]-4-hexadecene derivatives, heptacyclo-5-eicosene derivatives, heptacyclo-5-heneicosene derivatives, tricyclo[4.3.0.$1^{2,5}$]-3-decene derivatives, tricyclo[4.4.0.$1^{2,5}$]-3-undecene derivatives, pentacyclo[6.5.1.$1^{3,6}$.$0^{2,7}$.$0^{9,13}$]-4-pentadecene derivatives, pentacyclopentadecadiene derivatives, pentacyclo[7.4.0.$1^{2,5}$.$1^{9,12}$.$0^{8,13}$]-3-pentadecene derivatives, heptacyclo [8.7.0.$1^{3,6}$.$1^{10,17}$.$1^{12,15}$.$0^{2,7}$.$0^{11,16}$]-4-eicosene derivatives, nonacyclo[10.9.1.$1^{4,7}$.$1^{13,20}$.$1^{15,18}$.$0^{3,8}$.$0^{2,10}$.$0^{12,21}$.$0^{14,19}$]-5-pentacosene derivatives, pentacyclo[8.4.0.$1^{2,5}$.$1^{9,12}$.$0^{8,13}$]-3-hexadecene derivatives, heptacyclo[8.8.0.$1^{4,7}$.$1^{11,18}$.$1^{13,16}$.$0^{3,8}$.$0^{12,17}$]-5-heneicosene derivatives, nonacyclo-[10.10.1.$1^{5,8}$.$1^{14,21}$.$1^{16,19}$.$0^{2,11}$.$0^{4,9}$.$0^{13,22}$.$0^{15,20}$]-5-hexacosene derivatives, 1,4-methano-1,4,4a,9a-tetrahydrofluorene derivatives, 1,4-methano-1,4,4a,5,10,10a-hexahydro-anthracene derivatives and cyclopentadiene-acenaphthylene adducts.

More specifically, examples of the norbornene monomers include bicyclo[2.2.1]hept-2-ene derivatives such as bicyclo [2.2.1]hept-2-ene, 6-methylbicyclo[2.2.1]hept-2-ene, 5,6-dimethylbicyclo[2.2.1]hept-2-ene, 1-methyl-bicyclo[2.2.1] hept-2-ene, 6-ethylbicyclo[2.2.1]hept-2-ene, 6-n-butylbicyclo[2.2.1]hept-2-ene. 6-isobutylbicyclo-[2.2.1] hept-2-ene and 7-methylbicyclo[2.2.1]hept-2-ene; tetracyclo[4.4.0.$1^{2,5}$.$1^{7,10}$]-3-dodecene derivatives such as tetracyclo[4.4.0.$1^{2,5}$.$1^{7,10}$]-3-dodecene, 8-methyltetracyclo-[4.4.0.$1^{2,5}$.$1^{7,10}$]-3-dodecene, 8-ethyltetracyclo[4.4.0.$1^{2,5}$.$1^{7,10}$)]-3-dodecene, 8-propyltetracyclo[4.4.0.$1^{2,5}$.$1^{7,10}$]-3-dodecene, 8-butyl-tetracyclo[4.4.0.$1^{2,5}$.$1^{7,10}$]-3-dodecene, 8-isobutyltetracyclo[4.4.0.$1^{2,5}$.$1^{7,10}$]-3-dodecene, 8-hexyl-tetracyclo[4.4.0.$1^{2,5}$.$1^{7,10}$]-3-dodecene, 8-cyclohexyl-tetracyclo[4.4.0.$1^{2,5}$.$1^{7,10}$]-3-dodecene, 8-stearyltetracyclo-[4.4.0.$1^{2,5}$.$1^{7,10}$]-3-dodecene, 5,10-dimethyltetracyclo-[4.4.0.$1^{2,5}$.$1^{7,10}$]-3-dodecene, 2,10-dimethyltetracyclo-[4.4.0.$1^{2,5}$.$1^{7,10}$]-3-dodecene, 8,9-dimethyethyltetracyclo-[4.4.0.$1^{2,5}$.$1^{7,10}$]-3-dodecene, 8-ethyl-9-methyltetracyclo-[4.4.0.$1^{2,5}$.$1^{7,10}$]-3-dodecene, 11,12-dimethyltetracyclo-[4.4.0.$1^{2,5}$.$1^{7,10}$]-3-dodecene, 2,7,9-trimethyltetracyclo-[4.4.0.$1^{2,5}$.$1^{7,10}$]-3-dodecene, 9-ethyl-2,7-dimethyl-[4.4.0.$1^{2,5}$.$1^{7,10}$]-3-dodecene, tetracyclo[4.4.0.$1^{2,5}$.$1^{7,10}$]-3-dodecene, 9-isobutyl-2,7-dimethyltetracyclo[4.4.0.$1^{2,5}$.$1^{7,10}$]-3-dodecene, 9,11,12-trimethyltetracyclo[4.4.0.$1^{2,5}$.$1^{7,10}$]-3-dodecene, 9-ethyl-11,12-dimethyltetracyclo [4.4.0.$1^{2,5}$.$1^{7,10}$]-3-dodecene, 9-isobutyl-11,12-dimethyltetracyclo[4.4.0.$1^{2,5}$.$1^{7,10}$]-3-dodecene, dodecene, 5,8,9,10-tetrainethyltetracyclo[4.4.0.$1^{2,5}$.$1^{7,10}$]-3-dodecene, dodecene, 8-ethylidene-9-methyltetracyclo[4.4.0.$1^{2,5}$.$1^{7,10}$]-3-dodecene, 8-ethylidene-9-ethyltetracyclo[4.4.0.$1^{2,5}$.$1^{7,10}$]-3-dodecene, 8-ethylidene-9-isopropyltetracyclo-[4.4.0.$1^{2,5}$.$1^{7,10}$]-3-dodecene, 8-ethylidene-9-butyl-[4.4.0.$1^{2,5}$.$1^{7,10}$]-3-dodecene, tetracyclo[4.4.0.$1^{2,5}$.$1^{7,10}$]-3-dodecene, 8-n-propylidene-[4.4.0.$1^{2,5}$.$1^{7,10}$]-3-dodecene, tetracyclo [4.4.0.$1^{2,5}$.$1^{7,10}$]-3-dodecene, 8-n-propylidene-9-[4.4.0.$1^{2,5}$.$1^{7,10}$]-3-dodecene, methyltetracyclo[4.4.0.$1^{2,5}$.$1^{7,10}$]-3-dodecene, 8-n-propylidene-9-ethyltetracyclo[4.4.0.$1^{2,5}$.$1^{7,10}$]-3-dodecene, 8-n-propylidene-9-isopropyltetracyclo [4.4.0.$1^{2,5}$.$1^{7,10}$]-3-dodecene, 8-n-propylidene-9- butyltetracyclo[4.4.0.1$^{2,5}$.1$^{7,10}$]-3-dodecene, 8-isopropylidenetetracyclo[4.4.0.1$^{2,5}$.1$^{7,10}$]-3-dodecene, 8-isopropylidene-9-methyltetracyclo-[4.4.0.1$^{2,5}$.1$^{7,10}$]-3-dodecene, 8-isopropylidene-9-ethyl-[4.4.0.1$^{2,5}$.1$^{7,10}$]-3-dodecene, tetracyclo[4.4.0.1$^{2,5}$.1$^{7,10}$]-3-dodecene, 8-isopropylidene-9-[4.4.0.1$^{2,5}$.1$^{7,10}$]-3-dodecene, isopropyltetracyclo[4.4.0.1$^{2,5}$.1$^{7,10}$]-3-dodecene, 8-iso-[4.4.0.1$^{2,5}$.1$^{7,10}$]-3-dodecene, propylidene-9-butyltetracyclo[4.4.0.1$^{2,5}$.1$^{7,10}$]-3-dodecene, 8-chlorotetracyclo[4.4.0.1$^{2,5}$.1$^{7,10}$]-3-dodecene, 8-bromo-[4.4.0.1$^{2,5}$.1$^{7,10}$]-3-dodecene, tetracyclo[4.4.0.1$^{2,5}$.1$^{7,10}$]-3-dodecene, 8-fluorotetracyclo-[4.4.0.1$^{2,5}$.1$^{7,10}$]-3-dodecene, and 8,9-dichlorotetracyclo-[4.4.0.1$^{2,5}$.1$^{7,10}$]-3-dodecene, hexacyclo[6.6.1.1$^{3,6}$.1$^{10,13}$.0$^{2,7}$.0$^{9,14}$)]-4-heptadecene derivatives such as hexacyclo-[6.6.1.1$^{3,6}$.1$^{10,13}$.0$^{2,7}$.0$^{9,14}$)]-4-heptadecene, 12-methylhexacyclo[6.6.1.1$^{3,6}$.1$^{10,13}$.0$^{2,7}$.0$^{9,14}$)]-4-heptadecene, 12-ethylhexacyclo[6.6.1.1$^{3,6}$.1$^{10,13}$.0$^{2,7}$.0$^{9,14}$)]-4-heptadecene, 12-isobutylhexacyclo[6.6.1.1$^{3,6}$.1$^{10,13}$.0$^{2,7}$.0$^{9,14}$)]-4-heptadecene and 1,6,10-trimethyl-12-isobutylhexacyclo-[6.6.1.1$^{3,6}$.1$^{10,13}$.0$^{2,7}$.0$^{9,14}$)]-4-heptadecene; octacyclo-[8.8.0.1$^{2,9}$.1$^{4,7}$.1$^{11,18}$.1$^{13,16}$.0$^{3,8}$.0$^{12,17}$]-5-docosene derivatives such as octacyclo[8.8.0.1$^{2,9}$.1$^{4,7}$.1$^{11,18}$.1$^{13,16}$.0$^{3,8}$.0$^{12,17}$]-5-docosene, 15-methyloctacyclo[8.8.0.1$^{2,9}$.1$^{4,7}$.1$^{11,18}$.1$^{13,16}$.0$^{3,8}$.0$^{12,17}$]-5-docosene and 15-ethyloctacyclo[8.8.0.1$^{2,9}$.1$^{4,7}$.1$^{11,18}$.1$^{13,16}$.0$^{3,8}$.0$^{12,17}$]-5-docosene; pentacyclo[6.6.1.1$^{3,6}$.0$^{2,7}$.0$^{9,14}$]-4-hexadecene derivatives such as pentacyclo-[6.6.1.1$^{3,6}$. 0$^{2,7}$. 0$^{9,14}$]-4-hexadecene, 1,3-dimethylpentacyclo-[6.6.1.1$^{3,6}$. 0$^{2,7}$.0$^{9,14}$]-4-hexadecene, 1,6-dimethylpentacyclo-[6.6.1.1$^{3,6}$.0$^{2,7}$.0$^{9,14}$]-4-hexadecene and 15,16-dimethylpenta-cyclo[6.6.1.1$^{3,6}$.0$^{2,7}$.0$^{9,14}$]-4-hexadecene; heptacyclo-5-eicosene derivatives or heptacyclo-5-heneicosene derivatives such as heptacyclo[8.7.0.1$^{2,9}$.1$^{4,7}$.1$^{11,17}$.0$^{3,8}$.0$^{12,16}$]-5-eicosene and heptacyclo[8.8.0.1$^{2,9}$.1$^{4,7}$.1$^{11,18}$.1$^{13,16}$.0$^{3,8}$.0$^{12,17}$]-5-heneicosene; tricyclo[4.3.0.1$^{2,5}$]-3-decene derivatives such as tricyclo[4.3.0.1$^{2,5}$]-3-decene, 2-methyltricyclo[4.3.0.1$^{2,5}$]-3-decene and 5-methyltricyclo-[4.3.0.1$^{2,5}$]-3-decene; tricyclo[4.3.0.1$^{2,5}$]-3-undecene derivatives such as tricyclo[4.3.0.1$^{2,5}$]-3-undecene and 10-methyltricyclo[4.3.0.1$^{2,5}$]-3-undecene; pentacyclo-[6.5.1.1$^{3,6}$.0$^{2,7}$.0$^{9,13}$]-4-pentadecene derivatives such as pentacyclo[6.5.1.1$^{3,6}$.0$^{2,7}$.0$^{9,13}$]-4-pentadecene, 1,3-dimethyl-pentacyclo[6.5.1.1$^{3,6}$.0$^{2,7}$.0$^{9,13}$]-4-pentadecene, 1,6-dimethyl-pentacyclo[6.5.1.1$^{3,6}$.0$^{2,7}$.0$^{9,13}$]-4-pentadecene and 14,15-dimethylpentacyclo[6.5.1.1$^{3,6}$.0$^{2,7}$.0$^{9,13}$]-4-pentadecene; diene compounds such as pentacyclo[6.5.1.1$^{3,6}$.0$^{2,7}$.0$^{9,13}$]-4,10-pentadecadiene; pentacyclo[7.4.0.1$^{2,5}$.1$^{9,12}$.0$^{8,13}$]-3-penta-decene derivatives such as pentacyclo[7.4.0.1$^{2,5}$.1$^{9,12}$.0$^{8,13}$]-3-pentadecene and methyl-substituted pentacyclo-[7.4.0.1$^{2,5}$.1$^{9,12}$.0$^{8,13}$]-3-pentadecene; heptacyclo-[8.7.0.1$^{3,6}$.1$^{10,17}$.1$^{12,15}$.0$^{2,7}$.0$^{11,16}$]-4-eicosene derivatives such as heptacyclo[8.7.0.1$^{3,6}$.1$^{10,17}$.1$^{12,15}$.0$^{2,7}$.0$^{11,16}$]-4-eicosene and dimethyl-substituted heptacyclo-[8.7.0.1$^{3,6}$.1$^{10,17}$.1$^{12,15}$.0$^{2,7}$.0$^{11,16}$]-4-eicosene; nonacyclo-[10.9.1.1$^{4,7}$.1$^{13,20}$.1$^{15,18}$.0$^{3,8}$.0$^{2,10}$.0$^{12,21}$.0$^{14,19}$]-5-pentacosene derivatives such as nonacyclo[10.9.1.1$^{4,7}$.1$^{13,20}$.1$^{15,18}$.0$^{3,8}$.0$^{2,10}$0$^{12,21}$0$^{14,19}$]-5-pentacosene and trimethyl-substituted nonacyclo[10.9.1.1$^{4,7}$.1$^{13,12}$.1$^{15,18}$.0$^{3,8}$.0$^{2,10}$.0$^{12,21}$.0$^{14,19}$]-5-pentacosene; pentacyclo[8.4.0.1$^{2,5}$.1$^{9,12}$.0$^{8,13}$]-3-hexadecene derivatives such as pentacyclo[8.4.0.1$^{2,5}$.1$^{9,12}$.0$^{8,13}$]-3-hexadecene, 11-methylpentacyclo[8.4.0.1$^{2,5}$.1$^{9,12}$.0$^{8,13}$]-3-hexadecene, 11-ethylpentacyclo[8.4.0.1$^{2,5}$.1$^{9,12}$.0$^{8,13}$]-3-hexadecene and 10,11-dimethylpentacyclo[8.4.0.1$^{2,5}$.1$^{9,12}$.0$^{8,13}$]-3-hexadecene; heptacyclo-[8.8.0.1$^{4,7}$.1$^{11,18}$.1$^{13,16}$.0$^{3,8}$.0$^{12,17}$]-5-heneicosene derivatives such as heptacyclo-[8.8.0.1$^{4,7}$.1$^{11,18}$.1$^{13,16}$.0$^{3,8}$.0$^{12,17}$]-5-heneicosene, 15-methylheptacyclo[8.8.0.1$^{4,7}$.1$^{11,18}$.1$^{13,16}$. 0$^{3,8}$.0$^{12,17}$]-5-heneicosene and trimethylheptacyclo[8.8.0.1.1$^{4,7}$.1$^{11,18}$.1$^{13,16}$.0$^{3,8}$.0$^{12,17}$]-5-heneicosene; nonacyclo[10.10.1.1$^{5,8}$.1$^{14,21}$.1$^{16,19}$.1$^{2,11}$.0$^{4,9}$.0$^{13,22}$.0$^{15,20}$]-6-hexacosene derivatives such as nonacyclo-[10.10.1.1$^{5,8}$.1$^{14,21}$.1$^{16,19}$.0$^{2,11}$.0$^{4,9}$.0$^{13,22}$.0$^{15,20}$]-6-hexacosene; pentacyclo[6.5.1.1$^{3,6}$.0$^{2,7}$.0$^{9,13}$]-4,11-pentadecadiene, methyl-substituted pentacyclo[6.5.1.1$^{3,6}$.0$^{2,7}$.0$^{9,13}$]-4,11-penta-decadiene, trimethyl-substituted pentacyclo[4.7.0.1$^{2,5}$.0$^{8,13}$.1$^{9,12}$]-3-pentadecene, pentacyclo[4.7.0.1$^{2,5}$.0$^{8,13}$.1$^{9,12}$]3,10-pentadecadiene, methyl-substituted pentacyclo-[4.7.0.1$^{2,5}$. 0$^{8,13}$.1$^{9,12}$]-3,10-pentadecadiene, methyl-substituted pentacyclo[4.7.0.1$^{2,5}$.0$^{8,13}$.1$^{9,12}$]-3,10-pentadecadiene, methyl-substituted heptacyclo-[7.8.0.1$^{3,6}$.0$^{2,7}$.1$^{10,17}$. 0$^{11,16}$.1$^{12,15}$]-4-eicosene, trimethyl-substituted heptacyclo[7.8.0.1$^{3,6}$.0$^{2,7}$.1$^{10,17}$.0$^{11,16}$.1$^{12,15}$]-4-eicosene, tetramethyl-substituted heptacyclo-[7.8.0.1$^{3,6}$.0$^{2,7}$.1$^{10,17}$.0$^{11,16}$.1$^{12,15}$]-4-eicosene, tricyclo-[4.3.0.1$^{2,5}$]-3,7-decadiene (i.e., dicyclopentadiene), 2,3-dihydrodicyclopentadiene, 5-phenyl-bicyclo[2.2.1]hept-2-ene (i.e., 5-phenyl-2-norbornene), 5-methyl-5-phenyl-bicyclo[2.2.1]hept-2-ene, 5-benzyl-bicyclo[2.2.1]hept-2-ene, 5-tolylbicyclo[2.2.1]hept-2-ene, 5-(ethylphenyl)-bicyclo[2.2.1]hept-2-ene, 5-(isopropylphenyl)-bicyclo-[2.2.1]hept-2-ene, 8-phenyl-tetracyclo[4.4.0.1$^{2,5}$.1$^{7,10}$]-3-dodecene, 8-methyl-8-phenyl-tetracyclo[4.4.0.1$^{2,5}$.1$^{7,10}$]-3 dodecene, 8-benzyl-tetracyclo[4.4.0.1$^{2,5}$.1$^{7,10}$]-3-dodecene, 8-tolyl-tetracyclo[4.4.0.1$^{2,5}$.1$^{7,10}$]-3-dodecene, 8-(ethyl-phenyl)-tetracyclo[4.4.0.1$^{2,5}$.1$^{7,10}$]-3-dodecene, 8-(iso-propylphenyl)-tetracyclo[4.4.0.1$^{2,5}$.1$^{7,10}$]-3-dodecene, 8,9-diphenyl-tetracyclo[4.4.0.1$^{2,5}$.1$^{7,10}$]-3-dodecene, 8-(biphenyl)-tetracyclo[4.4.0.1$^{2,5}$.1$^{7,10}$]-3-dodecene, 8-(β-naphthyl)-tetracyclo[4.4.0.1$^{2,5}$.1$^{7,10}$]-3-dodecene, 8-(α-naphthyl)-tetracyclo[4.4.0.1$^{2,5}$.1$^{7,10}$]-3-dodecene, 8-(anthracenyl)-tetracyclo[4.4.0.1$^{2,5}$.1$^{7,10}$]-3-dodecene, 11-phenyl-hexacyclo[6.6.1.1$^{3,6}$.0$^{2,7}$.0$^{9,14}$]-4-heptadecene, 6-(α-naphthyl)-bicyclo[2.2.1]-hept-2-ene, 5-(anthracenyl)-bicyclo[2.2.1]hept-2-ene, 5-(biphenyl)-bicyclo[2.2.1]-hept-2-ene, 5-(β-naphthyl)-bicyclo[2.2.1]hept-2-ene, 5,6-diphenyl-bicyclo[2.2.1]hept-2-ene, 9-(2-norbornen-5-yl)-carbazole, 1,4-methano-1,4,4a,4b,5,8,8a,9a-octahydro-fluorene and derivatives thereof; 1,4-methano-1,4,4a,9a-tetrahydrofluorene and derivatives thereof, such as 1,4-methano-1,4,4a,9a-tetrahydrofluorene, 1,4-methano-8-methyl-1,4,4a,9a-tetrahydrofluorene, 1,4-methano-8-chloro-1,4,4a,9a-tetrahydrofluorene and 1,4-methano-8-bromo-1,4,4a,9a-tetrahydrofluorene; 1,4-methano-1,4,4a,9a-tetrahydrobenzofuran and derivatives thereof; 1,4-methano-1,4,4a,9a-tetrahydrocarbazole and derivatives thereof, such as 1,4-methano-1,4,4a,9a-tetrahydrocarbazole and 1,4-methano-9-phenyl-1,4,4a,9a-tetrahydrocarbazole; 1,4-methano-1,4,4a,5,10,10a-hexahydroanthracene and derivatives thereof, such as 1,4-methano-1,4,4a,5,10,10a-hexahydroanthracene; 7,10-methano-6b,7,10,10a-tetrahydro-fluoracene and derivatives thereof; and compounds obtained by further adding cyclopentadiene to cyclopentadiene-acenaphthylene adducts, 11,12-benzopentacyclo[6.5.1.1$^{3,6}$.0$^{2,7}$.0$^{9,13}$]-4-pentadecene, 11,12-benzopentacyclo[6.6.1.1$^{3,6}$.0$^{2,7}$.0$^{9,14}$]-4-hexadecene, 14,15-benzoheptacyclo[8.7.0.1$^{2,9}$.1$^{4,7}$.1$^{11,17}$.0$^{3,8}$.0$^{12,16}$]-5-eicosene, and cyclopentadiene-acenaphthylene adducts.

These norbornene monomers may be used either singly or in any combination thereof.

For example, α-olefins such as 1-butene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene and 1-eicosene; non-conjugated diolefins such as 1,4-hexadiene; etc. may be used within a range of up to about 10 mol % as a molecular weight modifier.

(2) Ring-opening Polymerization:

The ring-opening polymer of the norbornene monomer can be obtained by subjecting the norbornene monomer to ring-opening polymerization, generally, at a polymerization temperature of −50° C. to 100° C. and a polymerization pressure of 0 to 50 kg/cm² in a solvent or without using any solvent using, as a ring-opening polymerization catalyst, a catalyst system composed of a halide, nitrate or acetylacetone compound of a metal such as ruthenium, rhodium, palladium, osmium, iridium or platinum, and a reducing agent; a catalyst system composed of a halide or acetylacetone compound of a metal such as titanium, vanadium, zirconium, tungsten or molybdenum, and an organoaluminum compound; or the like.

A third component such as molecular oxygen, alcohol, ether, peroxide, carboxylic acid, acid anhydride, acid chloride, ester, ketone, nitrogen-containing compound, sulfur-containing compound, halogen-containing compound, molecular iodine or any other Lewis acid can be added to the catalyst system to improve polymerization activity and selectivity of ring-opening polymerization.

(3) Hydrogenation:

The hydrogenated product of the ring-opening polymer of the norbornene monomer can be obtained by hydrogenating the ring-opening polymer with hydrogen in the presence of a hydrogenation catalyst in accordance with a method known per se in the art.

Examples of the hydrogenation catalyst include catalysts composed of a combination of a transition metal compound and an alkyl metal compound, for example, combinations of cobalt acetate/triethylaluminum, nickel acetylacetonate/triisobutylaluminum, titanocene dichloride/n-butyllithium, zirconocene dichloride/sec-butyllithium, tetrabutoxytitanate/dimethylmagnesium, etc.

The hydrogenation reaction is generally carried out in an inert organic solvent. The organic solvent is preferably a hydrocarbon solvent because it has the excellent ability to dissolve a hydrogenated product formed therein. A cyclic hydrocarbon solvent is more preferred. Examples of such a hydrocarbon solvent include aromatic hydrocarbons such as benzene and toluene; aliphatic hydrocarbons such as n-pentane and hexane; alicyclic hydrocarbons such as cyclohexane and decalin; and ethers such as tetrahydrofuran and ethylene glycol dimethyl ether. At least two of these solvents may also be used in combination. The solvent may be generally the same as that used in the polymerization reaction, and so it is only necessity to add the hydrogenation catalyst to the polymerization reaction mixture as it is, so as to conduct the reaction.

The norbornene polymers used in the present invention preferably have high weather resistance and resistance to deterioration by light. Therefore, it is preferred that generally at least 95%, preferably at least 98%, more preferably at least 99% of the unsaturated bonds in the main chain structures of the ring-opening polymers should be saturated. The unsaturated bonds in an aromatic ring structure may be hydrogenated. However, it is desirable from the viewpoint of heat resistance that generally at least 20%, preferably at least 30%, more preferably at least 40% of the unsaturated bonds in the aromatic ring structure should remain unhydrogenated. The unsaturated bond in the main chain structure and the unsaturated bonds in the aromatic ring structure can be distinguishably identified by $^1$H-NMR analysis.

In order to mainly hydrogenate the unsaturated bond in the main chain structure, it is desirable that the hydrogenation reaction should be conducted at a temperature of generally −20° C. to 120° C., preferably 0 to 100° C., more preferably 20 to 80° C. under a hydrogen pressure of generally 0.1 to 50 kg/cm², preferably 0.5 to 30 kg/cm², more preferably 1 to 20 kg/cm².

(4) Thermoplastic Norbornene Polymer:

The thermoplastic norbornene polymers used in the present invention are ring-opening polymers of norbornene monomers or hydrogenated products thereof. Such a thermoplastic norbornene polymer can be typically obtained by subjecting a norbornene monomer represented by the formula (a) to ring-opening polymerization and hydrogenating the resultant polymer as needed.

As specific examples of such a polymer, may be mentioned polymers having repeating units represented,by the formula (A):

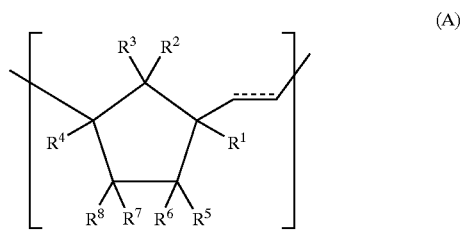

In the formula (A), $R^1$ to $R^8$ have the same meanings as defined in the formula (a). However, in the case where the carbon-carbon double bond in the main chain is hydrogenated, non-conjugated unsaturated bonds in side chains are also hydrogenated if any. When aromatic rings are present in side chains, it is desirable from the viewpoint of heat resistance that part or the whole of unsaturated bonds in the aromatic rings should remain unhydrogenated even after the hydrogenation.

--- in the formula (A) means either a single bond or a double bond. When the rate of hydrogenation is as high as at least 99%, the carbon-carbon double bond in the main chain is converted into a single bond. When the hydrogenation is partially conducted, the hydrogenated norbornene polymer is in a state that a single bond and a double bond coexist in the main chain.

When the norbornene monomer represented by the formula (a1) is subjected to ring-opening polymerization, and the resultant polymer is hydrogenated as needed, a polymer having repeating units represented by the formula (A1):

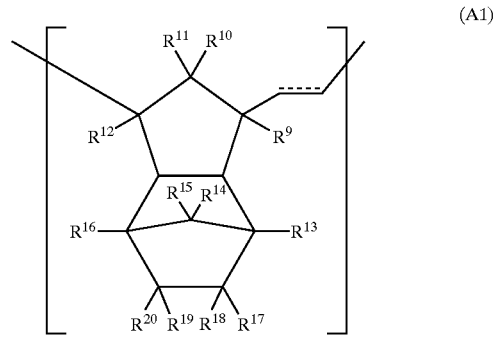

is obtained.

In the formula (A1), $R^9$ to $R^{20}$ have the same meanings as defined in the formula (a1). However, in the case where the carbon-carbon double bond in the main chain is hydrogenated,;non-conjugated unsaturated bonds in side chains are also hydrogenated if any. When aromatic rings are present in side chains, it is desirable from the viewpoint of heat resistance that part or the whole of unsaturated bonds in the aromatic rings should remain unhydrogenated even after the hydrogenation. ⋯ in the formula (A1) means either a single bond or a double bond.

When the norbornene monomer represented by the formula (a2) is subjected to ring-opening polymerization, and the resultant polymer is hydrogenated as needed, a polymer having repeating units represented by the formula (A2):

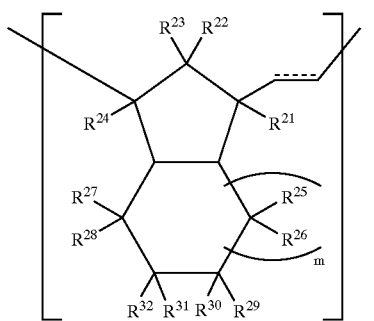

(A2)

is obtained.

In the formula (A2), $R^{21}$ to $R^{32}$ have the same meanings as defined in the formula (a2). However, in the case where the carbon-carbon double bond in the main chain is hydrogenated, non-conjugated unsaturated bonds in side chains are also hydrogenated if any. When aromatic rings are present in side chains, it is desirable from the viewpoint of heat resistance that part or the whole of unsaturated bonds in the aromatic rings should remain unhydrogenated even after the hydrogenation. ⋯ in the formula (A2) means either a single bond or a double bond.

The molecular weight of the thermoplastic norbornene polymer used is 500 to 500,000, preferably 3,000 to 300,000, more preferably 5,000 to 250,000 when expressed by a number average molecular weight (Mn) in terms of polystyrene as measured by gel permeation chromatography (GPC) using toluene as a solvent or when expressed by a number average molecular weight (Mn) in terms of polyisoprene as measured by GPC using cyclohexane as a solvent if the polymer is insoluble in toluene.

If the number average molecular weight (Mn) of the norbornene polymer is extremely low, the mechanical strength of the polymer becomes poor. If the molecular weight is extremely high on the other hand, the rate of graft modification with the unsaturated compound selected from the group consisting of unsaturated epoxy compounds and unsaturated carboxylic compounds cannot be heightened, and the processability of the resulting modified polymer is also deteriorated.

No particular limitation is imposed on the molecular weight distribution of the thermoplastic norbornene polymer. However, it is preferred that its ratio (Mw/Mn) of the weight average molecular weight (Mw) to the number average molecular weight (Mn) in terms of polystyrene as measured by GPC using toluene as a solvent be generally 4.0 or lower, preferably 3.0 or lower, more preferably 2.5 or lower, since the mechanical strength of the polymer is highly enhanced.

The glass transition temperature (Tg) of the thermoplastic norbornene polymer may be suitably selected as necessary for the end application intended. However, it is generally about 50 to 200° C. as measured by a differential scanning calorimeter (DSC). The thermoplastic norbornene polymer preferably has a high glass transition temperature because deterioration of mechanical strength of the polymer particularly in a region of high temperatures such as a temperature upon packaging of electronic parts and the like, and a reliability testing temperature is suppressed, and its viscosity characteristics also become excellent. Even when the glass transition temperature is comparatively low, however, the heat resistance can be sufficiently enhanced by using the modified polymer in combination with a crosslinking agent to form a crosslinked polymer.

(5) Graft Modification:

The graft monomer used in the present invention is an unsaturated compound selected from the group consisting of unsaturated epoxy compounds and unsaturated carboxylic compounds.

Examples of the unsaturated epoxy compounds include glycidyl esters such as glycidyl acrylate, glycidyl methacrylate and glycidyl p-styrylcarboxylate; monoglycidyl esters or polyglycidyl esters of unsaturated polycarboxylic acids such as endo-cis-bicyclo[2,2,1]hept-5-ene-2,3-dicarboxylic acid and endo-cis-bicyclo[2,2,1]-hept-5-ene-2-methyl-2,3-dicarboxylic acid; unsaturated glycidyl ethers such as allyl glycidyl ether, 2-methyl-allyl glycidyl ether, glycidyl ether of o-allylphenol, glycidyl ether of m-allylphenol and glycidyl ether of p-allylphenol; and 2-(o-vinylphenyl)ethylene oxide, 2-(p-vinylphenyl)ethylene oxide, 2-(o-allylphenyl) ethylene oxide, 2-(p-allylphenyl)ethylene oxide, 2-(o-vinylphenyl)propylene oxide, 2-(p-vinylphenyl)propylene oxide, 2-(o-allylphenyl)propylene oxide, 2-(p-allylphenyl)-propylene oxide, p-glycidylstyrene, 3,4-epoxy-i-butene, 3,4-epoxy-3-methyl-1-butene, 3,4-epoxy-1-pentene, 3,4-epoxy-3-methyl-1-pentene, 5,6-epoxy-1-hexene, vinylcyclohexene monoxide and allyl-2,3-epoxycyclopentyl ether. Of these, the allyl glycidyl esters and allyl glycidyl ethers are preferred, with the allyl glycidyl ethers being particularly preferred.

As the unsaturated carboxylic compounds, may be used unsaturated carboxylic acids or derivatives thereof. As examples of such unsaturated carboxylic acids, may be mentioned acrylic acid, maleic acid, fumaric acid, tetrahydrophthalic acid, itaconic acid, citraconic acid, crotonic acid, isocrotonic acid and nadic acid (endo-cis-bicyclo[2,2,]hept-5-ene-2,3-dicarboxylic acid). As examples of derivatives of the above-described unsaturated carboxylic acids, may be mentioned unsaturated carboxylic acid anhydrides, unsaturated carboxylic acid halides, unsaturated carboxylic acid amides, unsaturated carboxylic acid imides and ester compounds of unsaturated carboxylic acids. As specific examples of such derivatives, may be mentioned malenyl chloride, maleimide, maleic anhydride, citraconic anhydride, monomethyl maleate, dimethyl maleate and glycidyl maleate. Of these, the unsaturated dicarboxylic acids or acid anhydrides thereof are preferred, with maleic acid and nadic acid or acid anhydrides thereof being particularly preferred.

These graft monomers may be used either singly or in any combination thereof.

The modified thermoplastic norbornene polymers according to the present invention can be produced by subjecting such a graft monomer as described above and the thermoplastic norbornene polymer to graft modification by using any of various processes conventionally known. Examples of the processes include (1) a process comprising melting a thermoplastic norbornene polymer and adding a graft monomer to the melt to graft polymerize them, and (2) a process comprising dissolving a thermoplastic norbornene polymer in a solvent and then adding a graft monomer to the solution to graft copolymerize them. In addition, methods for producing the modified thermoplastic norbornene polymers include a method in which a graft monomer is mixed with an unmodified thermoplastic norbornene polymer in such a manner that the rate of graft modification of the resulting polymer reaches the desired rate, thereby modifying the polymer, and a method in which a graft-modified thermoplastic norbornene polymer having a high rate of graft modification is prepared in advance, and the modified thermoplastic norbornene polymer having the high rate of graft modification is diluted with an unmodified thermoplastic norbornene polymer to produce a graft-modified thermoplastic norbornene polymer having the desired rate of graft modification. In the present invention, any production process or method may be adopted.

In order to efficiently graft copolymerize the graft monomer, it is generally preferred to carry out a reaction in the presence of a radical initiator.

As the radical initiator, for example, organic peroxides, organic peresters, etc. may be preferably used. As specific examples of such radical initiators, may be mentioned benzoyl peroxide, dichlorobenzoyl peroxide, dicumyl peroxide, di-tert-butyl peroxide, 2,5-dimethyl-2,5-di(tert-butyl peroxybenzoate)hexyne-3, 1,4-bis(tert-butyl peroxyisopropyl)benzene, lauroyl peroxide, tert-butyl peracetate, 2,5-di(tert-butyl peroxy)hexyne-3, 2,5-dimethyl-2,5-di(tert-butyl peroxy)hexane, tert-butyl perbenzoate, tert-butyl peracetate, tert-butyl perisobutyrate, tert-butyl per-sec-octoate, tert-butyl perpivalate, cumyl perpivalate and tert-butyl perdiethylacetate.

In the present invention, azo compounds may also be used as radical initiators. As specific examples of the azo compounds, may be mentioned azobisisobutyronitrile and dimethyl azoisobutyrate.

Of these, benzoyl peroxide, and dialkyl peroxides such as dicumyl peroxide, di-tert-butyl peroxide, 2,5-dimethyl-2,5-di(tert-butyl peroxy)hexyne-3, 2,5-dimethyl-2,5-di(tert-butyl peroxy)hexane and 1,4-bis(tert-butyl peroxyisopropyl) benzene are preferably used as the radical initiators.

These radical initiators may be used either singly or in any combination thereof. A proportion of the radical initiator used is generally within a range of 0.001 to 10 parts by weight, preferably 0.01 to 5 parts by weight, more preferably 0.1 to 2.5 parts by weight per 100 parts by weight of the unmodified thermoplastic norbornene polymer.

No particular limitation is imposed on the graft-modifying reaction, and the reaction may be carried out in accordance with a method known per se in the art. The reaction is conducted at a temperature of generally 0 to 400° C., preferably 60 to 350° C. The reaction time is generally within a range of 1 minute to 24 hours, preferably 30 minutes to 10 hours.

(6) Modified Thermoplastic Norbornene Polymer:

The molecular weight of the modified thermoplastic norbornene polymer is within a range of 500 to 500,000, preferably 3,000 to 300,000, more preferably 5,000 to 250,000 when expressed by a number average molecular weight (Mn) in terms of polystyrene as measured by gel permeation chromatography (GPC) using toluene as a solvent or when expressed by a number average molecular weight (Mn) in terms of polyisoprene as measured by GPC using cyclohexane as a solvent if the modified thermoplastic norbornene polymer is insoluble in toluene.

When the modified thermoplastic norbornene polymer is used as a high-concentration solution, a composition with a great amount of compounding additives or an impregnating solution for reinforcing base materials, its number average molecular weight (Mn) is controlled within a range of generally 500 to 20,000, preferably 3,000 to 20,000, more preferably 5,000 to 19,500.

On the other hand, when the modified thermoplastic norbornene polymer is used in application fields such as an interlayer insulating film, its number average molecular weight (Mn) is generally controlled so as to exceed 20,000, and its upper limit is at most 500,000, preferably at most 300,000, more preferably at most 250,000.

If the number average molecular weight (Mn) of the modified thermoplastic norbornene polymer is extremely low, the mechanical strength of the polymer becomes poor. If the molecular weight is extremely high on the other hand, the viscosity of the modified thermoplastic norbornene polymer when dissolved in a solvent is increased, and so the concentration of solids including compounding additives cannot be heightened, and its processability is also deteriorated. It is hence not preferred to use the modified thermoplastic norbornene polymer having such an extremely low or high molecular weight.

The molecular weight distribution of the modified thermoplastic norbornene polymer may be suitably selected as necessary for the end application intended. However, it is preferred that its ratio (Mw/Mn) of the weight average molecular weight (Mw) to the number average molecular weight (Mn) as measured by GPC under the above-described conditions be generally 4.0 or lower, preferably 3.5 or lower, more preferably 2.5 or lower, since the mechanical strength of the polymer is particularly high. In mane cases, Mw/Mn is 2.0 or lower.

The rate of graft modification of the modified thermoplastic norbornene polymer used in the present invention is suitably selected as necessary for the end application intended. However, it is generally within a range of 10 to 100 mol %, preferably 15 to 50 mol %, more preferably 15 to 35 mol % based on the total number of monomer units in the polymer. The modified thermoplastic norbornene polymer the rate of graft modification of which falls within this range is preferred because the electrical properties such as dielectric constant, adhesion property to metals, silicon wafers and the like, ability to uniformly disperse various kinds of compounding additives therein, etc. are balanced with one another at a high level. If the rate of graft modification is too low, its adhesion property to other materials such as metals and silicon wafers becomes deteriorated, and in its turn, the heat resistance, durability and the like also become deteriorated.

The rate of graft modification is represented by the following equation (1):

$$\text{Rate of graft modification (mol \%)} = (X/Y) \times 100 \qquad (1)$$

wherein

X: the total number of moles of the modifying group introduced into the polymer by grafting of the unsaturated compound; and Y: the total number of monomer units in the polymer (weight average molecular weight of the polymer/ average molecular weight of the monomer).

X can be said to be the total number of moles of modifying residue introduced by the graft monomer and can be determined by $^1$H-NMR. Y is equal to a ratio of the weight average molecular weight (Mw) of the polymer/the molecular weight of the monomer. In the case of copolymerization, the molecular weight of the monomer is defined as an average molecular weight of monomers.

The modified thermoplastic norbornene polymer according to the present invention is a graft-modified polymer having a structure that the unsaturated compound is bonded to the thermoplastic norbornene polymer as a backbone polymer by a graft reaction. The repeating unit in the grafted moiety is determined by the kind of the graft monomer (unsaturated compound).

The modified thermoplastic norbornene polymers according to the present invention feature that (1) the heat resistance and electrical properties such as dielectric constant are fully excellent, (2) the concentration of their solutions can be sufficiently heightened, (3) compounding additives can be uniformly dispersed at a high concentration in their solutions, and the number of kinds of compounding additives capable of being uniformly dispersed therein can be increased, and (4) since the rate of graft modification is high, prepregs, laminates, interlayer insulating films, overcoats and the like obtained by using the modified thermoplastic norbornene polymers are excellent in adhesion property (peel strength) to other materials such as metals (metal foils, metallized films, metallic wirings, etc.) and silicon wafers.

Crosslinking Polymer Composition

The crosslinking polymer composition according to the present invention features that it contains at least the above-described modified thermoplastic norbornene polymer and a crosslinking agent as essential components.

No particular limitation is imposed on the method for crosslinking the crosslinking polymer composition according to the present invention. For example, the crosslinking can be conducted by using heat, light, radiation and/or the like. The kind of the crosslinking agent is suitably selected according to such means. When the above-described modified norbornene polymer is used, the ability to uniformly disperse various crosslinking agents therein also becomes good. Into the crosslinking polymer composition according to the present invention, as needed, a crosslinking aid, a flame retardant, other compounding additives, a solvent, etc. may be blended in addition to the crosslinking agent.

(1) Crosslinking Agent:

In order to crosslink the modified thermoplastic norbornene polymer according to the present invention, for example, a method of crosslinking the polymer by irradiation of radiation is also included. However, a method of crosslinking the polymer by blending a crosslinking agent is generally adopted. No particular limitation is imposed on the crosslinking agent. However, ① an organic peroxide, ② a crosslinking agent capable of exhibiting its effect by heat, ③ a crosslinking agent capable of exhibiting its effect by light, or the like is used.

① Organic Peroxide:

Examples of the organic peroxide include ketone peroxides such as methyl ethyl ketone peroxide and cyclohexanone peroxide; peroxyketals such as 1,1-bis(t-butyl peroxy)-3,3,5-trimethylcyclohexane and 2,2-bis(t-butyl peroxy)butane; hydroperoxides such as t-butyl hydroperoxide and 2,5-dimethylhexane-2,5-dihydroperoxide; dialkyl peroxides such as dicumyl peroxide, 2,5-dimethyl-2,5-di(t-butyl peroxy)hexyne-3 and α,α'-bis(t-butyl peroxy-m-isopropyl)benzene; diacyl peroxides such as octanoyl peroxide and isobutyryl peroxide; and peroxyesters such as peroxydicarbonate. Of these, the dialkyl peroxides are preferred from the viewpoint of performance of the crosslinked resin. It is preferred to change the kind of the alkyl group according to the forming or molding temperature.

The organic peroxides may be used either singly or in any combination thereof. The amount of the organic peroxide blended is generally 0.001 to 30 parts by weight, preferably 0.01 to 25 parts by weight, more preferably 1 to 20 parts by weight per 100 parts by weight of the modified thermoplastic norbornene polymer. The blending amount within this range is preferred because crosslinkability of the resulting composition, and properties of the crosslinked resin, such as electrical properties, chemical resistance and water resistance, are balanced with one another at a high level.

② Crosslinking Agent Capable of Exhibiting its Effect by Heat:

No particular limitation is imposed on the crosslinking agent capable of exhibiting its effect by heat so far as it can cause a crosslinking reaction by heating. Examples thereof include aliphatic polyamines such as diamines, triamines and still higher polyamines, alicyclic polyamines, aromatic polyamines, bisazides, acid anhydrides, dicarboxylic acids, diols, polyhydric phenols and polyamides. Specific examples thereof include aliphatic polyamines such as hexamethylenediamine, triethylenetetramine, diethylenetriamine and tetraethylenepentamine; alicyclic polyamines such as diaminocyclohexane, 3(4),8(9)-bis(aminomethyl) tricyclo-$[5,2,1,0^{2,6}]$decane, 1,3-(diaminomethyl) cyclohexane, menthenediamine, isophoronediamine, N-aminoethylpiperazine, bis(4-amino-3-methylcyclohexyl) methane and bis(4-amino-cyclohexyl)methane; aromatic polyamines such as 4,4'-diaminodiphenyl ether, 4,4'-diaminodiphenylmethane, α,α'-bis(4-aminophenyl)-1,3-diisopropylbenzene, α,α'-bis(4-aminophenyl)-1,4-diisopropylbenzene, 4,4'-diaminodiphenyl sulfone and m-phenylenediamine; bisazides such as 4,4'-bisazidobenzal (4-methyl)cyclohexanone, 4,4'-diazido-chalcone, 2,6-bis(4'-azidobenzal)cyclohexanone, 2,6-bis-(4'-azidobenzal)-4-methylcyclohexanone, 4,4'-diazido-diphenyl sulfone, 4,4'-diazidodiphenylmethane and 2,2'-diazidostilbene; acid anhydrides such as phthalic anhydride, pyromellitic anhydride, benzophenone-tetracarboxylic acid anhydride, nadic anhydride, 1,2-cyclohexanedicarboxylic acid and maleic anhydride-modified polypropylene; dicarboxylic acids such as fumaric acid, phthalic acid, maleic acid, trimellitic acid and himic acid; polyhydric phenols such as phenol novolak resins and cresol novolak resin; polyhydric alcohols such as tricyclodecanediol, diphenylsilanediol, ethylene glycol and derivatives thereof, diethylene glycol and derivatives thereof, and triethylene glycol and derivatives thereof; and polyamides such as nylon 6, nylon 66, nylon 610, nylon 11, nylon 612, nylon 12, nylon 46, methoxymethylated polyamide, polyhexamethylenediamine terephthalamide and polyhexamethylene isophthalamide;.

These crosslinking agents may be used either singly or in any combination thereof. Of these, the aromatic polyamines, acid anhydrides, polyhydric phenols and polyhydric alcohols are preferred for reasons of providing a crosslinked resin excellent in heat resistance, mechanical strength, adhesion property and dielectric properties (low dielectric constant and dielectric loss tangent). Among others, 4,4-diaminodiphenylmethane (aromatic polyamine) and polyhydric alcohols are particularly preferred.

No particular limitation is imposed on the amount of the crosslinking agent blended. From the viewpoints of being able to efficiently conduct a crosslinking reaction and improve the physical properties of the resulting crosslinked resin, and being profitable, however, it is generally within a range of 0.001 to 30 parts by weight, preferably 0.01 to 25 parts by weight, more preferably 1 to 20 parts by weight per 100 parts by weight of the modified thermoplastic norbornene polymer. If the amount of the crosslinking agent is too little, the resulting composition becomes hard to undergo crosslinking, and so sufficient heat resistance and solvent resistance cannot be imparted to the composition. On the contrary, any amount too great results in a crosslinked resin lowered in properties such as water-absorption property and dielectric properties. It is hence not preferable to use the crosslinking agent in any amount outside the above range. Therefore, the blending amount within this range is preferred because these properties are balanced with one another at a high level.

As needed, a crosslinking accelerator (hardening accelerator) may also be blended to enhance the efficiency of the crosslinking reaction.

As examples of the hardening accelerator, may be mentioned amines such as pyridine, benzyldimethylamine, triethanolamine, triethylamine and imidazoles. The hardening accelerator is added in order to regulate the rate of the crosslinking reaction and further enhance the efficiency of the crosslinking reaction. No particular limitation is imposed on the amount of the hardening accelerator blended. However, it is used within a range of generally 0.1 to 30 parts by weight, preferably 1 to 20 parts by weight per 100 parts by weight of the thermoplastic norbornene polymer. The blending amount within this range is preferred because crosslinking density, dielectric properties, water absorption and the like of the crosslinked resin are balanced with one another at a high level. Among others, imidazoles are preferred in that a crosslinked resin excellent in dielectric properties can be provided.

③ Crosslinking Agent Capable of Exhibiting its Effect by Light:

No particular limitation is imposed on the crosslinking agent (hardener) capable of exhibiting its effect by light so far as it is a photoreactive substance which reacts with the modified thermoplastic norbornene polymer by irradiation of actinic rays such as ultraviolet rays such as g rays, h rays or i rays, far ultraviolet rays, X rays, or electron rays to form a crosslinked compound. Examples thereof include aromatic bisazide compounds, photo-induced amine generators and photo-induced acid generators.

Specific typical examples of the aromatic bisazide compounds include 4,4'-diazidochalcone, 2,6-bis(4'-azidobenzal)cyclohexanone, 2,6-bis(4'-azidobenzal)-4-methylcyclohexanone, 4,4'-diazidodiphenyl sulfone, 4,4'-diazidobenzophenone, 4,4'-diazidophenyl, 2,7-diazidofluorene and 4,4'-diazidophenylmethane. These compounds may be used either singly or in any combination thereof.

Specific. examples of the photo-induced amine generators include o-nitrobenzyloxycarbonylcarbamates, 2,6-dinitrobenzyloxycarbonylcarbamates and α,α-dimethyl-3,5-dimethoxybenzyloxycarbonylcarbamates of aromatic amines or aliphatic amines. More specifically, there may be mentioned o-nitrobenzyloxycarbonylcarbamates of aniline, cyclohexylamine, piperidine, hexamethylenediamine, triethylenetetramine, 1,3-(diaminomethyl)cyclohexane, 4,4'-diaminodiphenyl ether, 4,4'-diaminodiphenylmethane, phenylenediamine and the like. These compounds may be used either singly or in any combination thereof.

The photo-induced acid generator is a substance which forms a Brφnsted acid or Lewis acid upon exposure to actinic rays. Examples thereof include onium salts, halogenated organic compounds, quinonediazide compounds, α,α-bis(sulfonyl)diazomethane compounds, α-carbonyl-α-sulfonyl-diazomethane compounds, sulfone compounds, organic acid ester compounds, organic acid amide compounds and organic acid imide compounds. These compounds, which cleave upon exposure to the actinic rays to form an acid, may be used either singly or in any combination thereof.

As examples of other photo-crosslinking agents, may be mentioned benzoin alkyl ether compounds such as benzoin ethyl ether and benzoin isobutyl ether; benzophenone compounds such as benzophenone, methyl-o-benzoyl benzoate and 4,4'-dichlorobenzophenone; benzyl compounds such as dibenzyl and benzyl methyl ketal; acetophenone compounds such as 2,2-diethoxyacetophenone, 2-hydroxy-2-methylpropiophenone, 4-isopropyl-2-hydroxy-2-methylpropiophenone, 1,1-dichloroacetophenone, 2,2-diethoxyacetophenone and 4'-phenoxy-2,2-dichloroacetophenone; thioxanthone compounds such as 2-chloro-thioxanthone, 2-methylthioxanthone and 2-isopropylthioxanthone; anthraquinone compounds such as 2-ethylanthraquinone, 2-chloroanthraquinone and naphthoquinone; propiophenone compounds such as 2-hydroxy-2-methylpropiophenone and 4'-dodecyl-2-hydroxy-2-methylpropiophenone; and organic acid metal salts such as cobalt octenate, cobalt naphthenate, manganese octenate and manganese naphthenate.

No particular limitation is imposed on the amount of these photoreactive compounds blended. From the viewpoints of being able to efficiently conduct the reaction with the modified thermoplastic norbornene polymer, not impairing the physical properties of the resulting crosslinked resin, and being profitable, however, it is generally within a range of 0.001 to 30 parts by weight, preferably 0.01 to 25 parts by weight, more preferably 1 to 20 parts by weight per 100 parts by weight of the modified thermoplastic norbornene polymer. If the amount of the photoreactive substance added is too little, the resulting composition becomes hard to undergo crosslinking, and so sufficient heat resistance and solvent resistance cannot be imparted to the composition. On the other hand, any amount too great results in a crosslinked resin lowered in properties such as water-absorption property and dielectric properties. It is hence not preferable to use the photoreactive compound in any amount outside the above range. Therefore, the blending amount within this range is preferred because these properties are balanced with one another at a high level.

(2) Crosslinking Aid:

In the present invention, it is preferred to use a crosslinking aid, because the crosslinkability and the dispersibility of the compounding additives can be more enhanced.

No particular limitation is imposed on the crosslinking aid used in the present invention. Publicly known compounds disclosed in Japanese Patent Application Laid-Open No. 34924/1987 and the like may be used. Examples thereof include oxime nitroso type crosslinking aids such as quinone dioxime, benzoquinone dioxime and p-nitrosophenol; maleimide type crosslinking aids such as N,N-m-phenylenebismaleimide; allyl type crosslinking aids such as diallyl phthalate, triallyl cyanurate and triallyl isocyanurate; methacrylate type crosslinking aids such as ethylene glycol dimethacrylate and trimethylolpropane trimethacrylate; and vinyl type crosslinking aids such as vinyltoluene, ethylvinylbenzene and divinylbenzene. Of these, the allyl type crosslinking aids and methacrylate type crosslinking aids are preferred because they make it easy to uniformly disperse compounding additives.

The amount of the crosslinking aid added is suitably selected according to the kind of the crosslinking agent used. However, it is generally 0.1 to 10 parts by weight, preferably 0.2 to 5 parts by weight per part by weight of the crosslinking agent. If the amount of the crosslinking aid added is too little, the resulting composition becomes hard to undergo crosslinking. On the contrary, any amount too great results in a crosslinked resin having a possibility that its electrical properties, water resistance, moisture resistance and the like may be deteriorated.

(3) Flame Retardant:

The flame retardant is not an essential component. However, it is preferred that the flame retardant be added to the modified thermoplastic norbornene polymer compositions when the composition is used for electronic parts. No particular limitation is imposed on the flame retardant. However, those which undergo none of decomposition, denaturation and deterioration by the crosslinking agent (hardener) are preferred.

Various kinds of chlorine- or bromine-containing flame retardants may be used as the halogen-containing flame retardants. From the viewpoints of flameproofing effect, heat resistance upon forming or molding, dispersibility in resins and influence on the physical properties of the resins, however, the following flame retardants may be preferably used. Namely, preferable examples thereof include hexabromobenzene, pentabromo-ethylbenzene, hexabromobiphenyl, decabromodiphenyl, hexabromodiphenyl oxide, octabromodiphenyl oxide, decabromodiphenyl oxide, pentabromocyclohexane, tetrabromobisphenol A and derivatives thereof [for example, tetrabromobisphenol A-bis(hydroxyethyl ether), tetrabromobisphenol A-bis(2,3-dibromopropyl ether), tetrabromobisphenol A-bis(bromoethyl ether), tetrabromo-bisphenol A-bis(allyl ether), etc.], tetrabromobisphenol S and derivative thereof [for example, tetrabromobisphenol S-bis(hydroxyethyl ether), tetrabromobisphenol S-bis(2,3-dibromopropyl ether), etc.], tetrabromophthalic anhydride and derivatives thereof [for example, tetrabromophthal-imide, ethylenebistetrabromophthalimide, etc.], ethylene-bis(5,6-dibromonorbornene-2,3-dicarboxyimide), tris-(2,3-dibromopropyl-1) isocyanurate, adducts of hexabromocyclopentadiene by Diels-Alder reaction, tribromophenyl glycidyl ether, tribromophenyl acrylate, ethylenebis-tribromophenyl ether, ethylenebispentabromophenyl ether, tetradecabromodiphenoxybenzene, brominated polystyrene, brominated polyphenylene oxide, brominated epoxy resins, brominated polycarbonate, polypentabromobenzyl acrylate, octabromonaphthalene, hexabromocyclododecane, bis(tribromophenyl)fumaramide and N-methylhexabromo-diphenylamine.

These flame retardants may be used either singly or in any combination thereof. The amount of the flame retardant added is generally 3 to 150 parts by weight, preferably 10 to 140 parts by weight, particularly preferably 15 to 120 parts by weight per 100 parts by weight of the modified thermoplastic norbornene polymer.

As a flame retardant auxiliary for causing the flame retardant to more effectively exhibit its flameproofing effect, for example, an antimonial flame retardant auxiliary such as antimony trioxide, antimony pentoxide, sodium antimonate or antimony trichloride may be used. These flame retardant auxiliaries are used in a proportion of generally 1 to 30 parts by weight, preferably 2 to 20 parts by weight per 100 parts by weight of the flame retardant.

(4) Filler:

In order to improve mechanical strength (toughness) and reduce coefficient of linear expansion in particular, a filler may be blended into the crosslinking polymer compositions according to the present invention. Examples of the filler include inorganic and organic fillers.

No particular limitation is imposed on the inorganic fillers. Examples thereof include calcium carbonate (precipitated calcium carbonate, heavy or pulverized calcium, special calcium type fillers), clay (aluminum silicate; fine nepheline syenite powder, calcined clay, silane-modified clay), talc, silica, alumina, diatomaceous earth, quartz sand, pumice powder, pumice balloons, slate powder, mica powder, asbestos, alumina colloid (alumina sol), alumina white, aluminum sulfate, barium sulfate, lithopone, calcium sulfate, molybdenum disulfide, graphite, glass fibers, glass beads, glass flake, foamed glass beads, fly ash beads, volcanic glass balloons, synthetic inorganic balloons, monocrystalline potassium titanate, carbon fibers, carbon balloons, anthracite culm, artificial cryolite, titanium oxide, magnesium oxide, basic magnesium carbonate, dolomite, potassium titanate, calcium, sulfite, mica, asbestos, calcium silicate, montmorillonite, bentonite, graphite, aluminum powder, molybdenum sulfide, boron fibers and silicon carbide fibers.

Examples of the organic fillers include polyethylene fibers, polypropylene fibers, polyester fibers, polyamide fibers, fluorocarbon fibers, ebonite powder, thermosetting resin balloons, saran balloons, shellac, wood flour, cork powder, polyvinyl alcohol fibers, cellulose powder and wood pulp.

(5) Other Compounding Additives:

To the crosslinking polymer compositions according to the present invention, may be added proper amounts of other compounding additives such as heat stabilizers, weathering stabilizers, leveling agents, antistatic agents, slip agents, antiblocking agents, anti-fogging agents, lubricants, dyes, pigments, natural oil, synthetic oil and wax, as needed.

Specific examples thereof include phenolic antioxidants such as tetrakis[methylene-3(3,5-di-t-butyl-4-hydroxyphenyl) propionate]methane, alkyl β-(3,5-di-t-butyl-4-hydroxyphenyl) propionates and 2,2'-oxamido-bis[ethyl-3(3,5-di-t-butyl-4-hydroxyphenyl) propionate]; phosphoric stabilizers such as trisnonylphenyl phosphate, tris(2,4-di-t-butylphenyl) phosphate and tris(2,4-di-t-butylphenyl) phosphate; fatty acid metal salts such as zinc stearate, calcium stearate and calcium 12-hydroxy-stearate; polyhydric alcohol fatty acid esters such as glycerol monostearate, glycerol monolaurate, glycerol distearate, pentaerythritol monostearate, pentaerythritol distearate and pentaerythritol tristearate; synthetic hydrotalcite; amine type antistatic agents; leveling agents for paints, such as fluorine-containing nonionic surfactants, special acrylic resin type leveling agents and silicone type leveling agents; coupling agents such as silane coupling agents, titanate coupling agents, aluminum-containing coupling agents and zircoaluminate coupling agents; plasticizers; and colorants such as pigments and dyes.

These compounding additives may be used either singly or in any combination thereof. The compounding proportions thereof are suitably selected according to their respective functions and the end application intended.

Into the crosslinking polymer compositions, other kinds of thermoplastic resins such as polycarbonate, polystyrene, poly(phenylene sulfide), poly(ether imide), polyester, polyamide, polyarylate and polysulfone; elastomers or rubbery polymers; and the like may be blended for the purpose of controlling the mechanical properties and flexibility of the composition.

(6) Solvent:

In the present invention, the modified norbornene polymer may be dissolved in a solvent to prepare an impregnating solution for prepregs, produce a sheet by a solution casting method, or form a film by a coating method.

In the case where the modified thermoplastic norbornene polymer is dissolved in a solvent, examples of the solvent used include aromatic hydrocarbons such as toluene, xylene and ethylbenzene; aliphatic hydrocarbons such as n-pentane, hexane and heptane; alicyclic hydrocarbons such as cyclohexane; and halogenated hydrocarbons such as chlorobenzene, dichlorobenzene and trichlorobenzene.

The solvent is used in an amount sufficient to uniformly dissolve or disperse the modified thermoplastic norbornene polymer and the individual components optionally blended therein.

Molding, Prepreg, Laminate, Interlayer Insulating Film. etc.

The crosslinking polymer composition according to the present invention may be molded in the desired form and then crosslinked to form a crosslinked molding. The crosslinking polymer composition is molded after dissolving it in a solvent so as not to cause deterioration of moldability due to crosslinking in the course of molding, or by melting it at a temperature at which it undergoes no crosslinking, or crosslinking proceeds only;at a sufficiently low rate. Specifically, the norbornene polymer composition dissolved in a solvent is cast, and the solvent is removed to form a sheet, or a base material is impregnated with the composition dissolved in the solvent to conduct molding.

The crosslinking polymer composition according to the present invention can be molded into various parts in accordance with various molding processes. Examples of the molding processes in this case include ① a process in which the composition is processed into a molding in a state of a thermoplastic resin by injection molding, press molding, compression molding or the like, ② a process in which a solution with the composition dissolved in an organic solvent is processed into a molding by potting or cast molding while removing the solvent, and ③ a process in which the composition is processed into a thermoset molding by transfer molding or the like.

Further, the crosslinking polymer composition according to the present invention can be formed into a film by a coating method.

(1) Prepreg:

A prepreg which is one of specific examples of the crosslinked moldings is produced by uniformly dissolving or dispersing the modified thermoplastic norbornene polymer, crosslinking agent and various compounding additives in a solvent such as toluene, cyclohexane or xylene, impregnating a reinforcing base material with the solution or dispersion and then drying the base material to remove the solvent. In general, the prepreg is preferably produced so as to give a thickness of about 50 to 500 μMm.

The amount of the solvent used is controlled in such a manner that a solids concentration amounts to generally 1 to 90 wt. %, preferably 5 to 85 wt. %, more preferably 10 to 80 wt. %.

Examples of usable reinforcing base materials include paper base materials (linter paper, kraft paper, etc.), glass base materials (glass cloth, glass mat, glass paper, quartz fibers, etc.) and synthetic resin fiber base materials (polyester fibers, Aramide fibers, etc.). These reinforcing base materials may be surface treated with a treating agent such as a silane coupling agent. These reinforcing base materials may be used either singly or in any combination thereof.

The amount of the modified thermoplastic norbornene polymer composition to the reinforcing base material is suitably selected as necessary for the end application intended. However, it is generally 1 to 90 wt. %, preferably 10to 60 wt. % based on the reinforcing base material.

(2) Sheet:

No particular limitation is imposed on a process for producing a sheet. However, a casting process is generally used. For example, the crosslinking polymer composition according to the present invention is dissolved or dispersed in a solvent such as toluene, xylene or cyclohexane so as to give a solids concentration of about 5 to 50 wt. %, the solution or dispersion is cast or coated on a smooth surface, the solvent is removed by drying or the like, and the dried product is separated from the smooth surface to obtain a sheet. When the solvent is removed by drying, it is preferred to select a method by which foaming by rapid drying does not occur. For example, it is only necessary to volatilize the solvent to a certain extent at a low temperature and then raise the temperature so as to sufficiently volatilize the solvent.

As the smooth surface, may be used a planished metal plate, a carrier film made of a resin, or the like. When the resin-made carrier film is used, a solvent to be used and drying conditions are determined taking the solvent resistance and heat resistance of a material of the carrier film into consideration.

Sheets obtained by the casting process generally have a thickness of about 10 μm to 1 mm. These sheets can be used as interlayer insulating films, films for forming moisture-proof layers, etc. by crosslinking them. They may also be used in the production of laminates which will be described subsequently.

(3) Laminate:

A laminate is obtained by stacking a plurality of the above-described prepregs and/or uncrosslinked sheets on one another and hot-pressing them, thereby crosslinking and mutually fusion-bonding them into a necessary thickness. When a laminated sheet is used as a circuit board, a circuit is formed by, for example, laminating an electrically conductive layer for wiring composed of a metal foil or the like, or etching the surface. The electrically conductive layer for wiring may be laminated not only on the outer surface of the laminated sheet as a finished article, but also in the interior of the laminated sheet according to the purpose. In order to prevent warpage upon a secondary processing such as etching, it is preferred to laminate laminating materials in combination so as to vertically symmetrize. For example, the surfaces of the stacked prepregs and/or sheets are heated to a fusion-bonding temperature according to the modified thermoplastic norbornene polymer used or higher, generally about 150 to 300° C., and they are pressed under a pressure of about 30 to 80 kgf/cm$^2$, thereby crosslinking and mutually fusion-bonding the respective layers to obtain a laminated sheet.

Other methods for applying a metal to these insulating layers or a base material include vapor deposition, electroplating, sputtering, ion plating, spraying and layering. Examples of metals commonly used include copper, nickel, tin, silver, gold, aluminum, platinum, titanium, zinc and chromium. Copper is oftenest used in circuit boards.

(4) Crosslinking:

In the present invention, a molding is crosslinked by itself or in the form of a laminate to obtain a crosslinked molding. The crosslinking may be conducted in accordance with a method known per se in the art. Examples thereof include a method of irradiating a molding with radiation, a method of heating a molding to a certain temperature or higher in the case where an organic peroxide has been blended, and a method of irradiating a molding with rays such as ultraviolet rays in the case where a photo-crosslinking agent has been blended. Of these, the method in which the organic peroxide is blended, and the molding is heated to crosslink is preferred, since the method can be conducted with ease.

A temperature at which a crosslinking reaction is caused is mainly determined by a combination of an organic peroxide and a crosslinking aid. However, the crosslinking is conducted by heating a molding to a temperature of generally 80 to 350° C., preferably 120 to 300° C., more preferably 150 to 250° C. Crosslinking time is preferably determined to be about 4 times as much as the half-life of the organic peroxide, and is generally 5 to 120 minutes, preferably 10 to 90 minutes, more preferably 20 to 60 minutes. When a crosslinking agent (hardener) capable of exhibiting its effect by heat is used as the crosslinking agent, crosslinking is caused by heating. When a photo-crosslinking agent is used as the crosslinking agent, crosslinking can be caused by irradiation of light. When crosslinkable moldings are laminated and then crosslinked, fusion bonding and crosslinking occur between the respective layers, thereby obtaining an integral crosslinked molding.

(5) Crosslinked Molding:

Examples of crosslinked moldings according to the present invention include laminated sheets, circuit boards, interlayer insulating films and films for forming moisture-proof layers. The crosslinked moldings according to the present invention generally have a water absorption of at most 0.03%, and a dielectric constant of 2.0 to 4.0 and a dielectric loss tangent of 0.0005 to 0.005 as measured at a frequency of 1 MHz. Therefore, the moldings according to the present invention are superior in moisture resistance and electrical properties to the conventional thermoset moldings. The heat resistance of the crosslinked moldings according to the present invention is equal to that of the conventional thermoset moldings. Accordingly, even when a laminated sheet on which a copper foil has been laminated is brought into contact with a solder of 260° C. for 30 seconds or with a solder of 300° C. for 1 minute, abnormality such as delamination of the metal layer such as the copper foil and/or occurrence of blister is not observed. In addition, the crosslinked moldings according to the present invention are excellent in adhesion property to the copper foil as demonstrated by a peel strength of generally 1.4 to 2.7 kg/cm$^2$. This is far improved compared with the conventional thermoplastic norbornene resins. From these results, the laminated sheet which is a crosslinked molding according to the present invention is suitable for use as a circuit board.

Moldings obtained by using the crosslinking polymer compositions according to the present invention as thermoplastic resins are useful as electronic parts such as connectors, relays and capacitors; electronic parts such as injection-molded sealing parts for semiconductor devices such as transistors, ICs and LSIs; and body tubes for optical lenses and parts such as polygon mirrors and Fθ mirrors.

When the crosslinking polymer compositions according to the present invention are used in a state dissolved in an organic solvent, they are useful for uses such as sealing materials for potting and cast molding.

When the crosslinking polymer compositions according to the present. invention are used as transfer molding materials, they are useful as packaging (sealing) materials for -semiconductor devices.

The crosslinking polymer compositions according to the present invention can be used in the form of a film. In the case where they are used as films, there are cases ① where the crosslinking polymer composition is dissolved in an organic solvent, and the solution is formed into a film by a casting process or the like in advance to use it, and ② where the solution is applied, and the solvent is then removed to use a film formed as an overcoat. More specifically, such films are useful as, for example, insulating sheets for laminated sheets, interlayer insulating films, liquid sealing materials for semiconductor devices, overcoating materials, etc.

EXAMPLES

The present invention will hereinafter be described specifically by the following Examples and Comparative Examples. Incidentally, physical properties were measured in accordance with the following methods:

(1) The glass transition temperature was measured in accordance with the differential scanning calorimetry (DSC method).
(2) The molecular weight was determined in terms of polystyrene as measured by gel permeation chromatography (GPC) using toluene as a solvent unless expressly noted.
(3) The rates of hydrogenation in the main chain and side chain were determined by $^1$H-NMR.
(4) The total number of moles of modifying residue introduced by an unsaturated epoxy compound or unsaturated carboxylic compound was determined by $^1$H-NMR, and the rate of graft modification was calculated out in accordance with the above-described equation.
(5) The flame retardancy was determined in accordance with the US UL-94 test standard.
(6) The dielectric constant and dielectric loss tangent were determined at 1 MHz in accordance with JIS K 6911.
(7) The copper foil peeling strength was determined in the following manner. Namely, a specimen 20 mm wide and 100 mm long was cut out of a resin laminate sample, parallel notches were cut at an interval of 10 mm in the copper foil surface of the specimen, and the copper foil was continuously peeled off at a rate of 50 mm/min in a direction perpendicular to the surface by a tensile tester. The copper foil peeling strength was expressed in terms of the minimum stress value at this time.
(8) The adhesion property was determined by conducting a cross-cut peel strength test in accordance with JIS K 5400.
(9) The durability was determined by leaving a test sample to stand for 1,000 hours under conditions of 90° C. and 95% relative humidity to observe whether visual abnormality such as blister, the corrosion and/or tarnishing of copper, and the like occurred or not.
(10) The heat resistance was determined in the following manner. After a test sample was brought into contact with a solder of 300° C. for 1 minute, the appearance of the sample was observed to evaluate it in accordance with the following standard:
Good: Neither delamination nor blister was observed;
Poor: Delamination or blister was observed.

Example 1

A 1-liter flask purged with nitrogen was charged with 5 g of 8-ethyltetracyclo[4.4.0.1$^{2,5}$.1$^{7,10}$]-3-dodecene (i.e., 6-methyl-1,4:5,8-dimethano-1,4,4a,5,6,7,8,8a-octahydronaphthalene; hereinafter referred to as "ETD") and 120 g of toluene, followed by addition of 0.287 mmol of truisobutylaluminum and 0.287 mmol of isobutyl alcohol as polymerization catalysts, and 3.83 mmol of 1-hexene as a molecular weight modifier. To the mixture, 0.057 mmol of tungsten hexachloride was added, and stirring was conducted at 40° C. for 5 minutes. Thereafter, 45 g of ETD and 0.086 mmol of tungsten hexachloride were continuously added dropwise to the reaction system over about 30 minutes. After completion of the addition, stirring was continued for additional 30 minutes to complete polymerization.

This polymerization reaction mixture was transferred to a 1-liter autoclave, and 160 g of toluene were added thereto. After a mixture of 0.5 g of nickel acetylacetonate and 5.15 g of a 30 wt. % toluene solution of triisobutylaluminum was then added, and the interior of the autoclave was purged with hydrogen, the contents were heated to 80° C. with stirring. The hydrogen pressure was raised to 30 kg/cm$^2$ at the time the temperature was stable, thereby conducting a reaction for 3 hours while supplying hydrogen consumed in the course of the reaction. Then, 4.2 g of water and 2.5 g of activated alumina (specific surface area: 320 cm$^2$/g; pore volume: 0.8 cm$^3$/g; average particle size: 15 μm; Neobead D powder, product of Mizusawa Industrial Chemicals, Inc.) were added to the reaction mixture, followed by stirring at 80° C. for 1 hour. Solids were then removed by filtration, and the resultant hydrogenation, reaction mixture was poured into 3 liters of isopropyl alcohol to deposit a resin formed. The resin was collected by filtration and then dried for 48 hours at 100° C. under 1 Torr or lower.

Fifty parts by weight of the thus-obtained polymer were mixed with 30 parts by weight of allyl glycidyl ether, 3.0 parts by weight of dicumyl peroxide and 120 parts by weight of t-butylbenzene to conduct a reaction at 150° C. for 3 hours in an autoclave. The reaction mixture was then solidified and dried in the same manner as described above to obtain epoxy-modified Polymer (A). The result of the synthesis is shown in Table 1.

Example 2

Epoxy-modified Polymer (B) was obtained in the same manner as in Example 1 except that the amount of 1-hexene was changed from 3.83 mmol to 5.75 mmol. The result of the synthesis is shown in Table 1.

Example 3

Maleic anhydride-modified Polymer (C) was obtained in the same manner as in Example 1 except that allyl glycidyl ether was changed to maleic anhydride. The result of the synthesis is shown in Table 1.

Example 4

Maleic anhydride-modified Polymer (D) was obtained in the same manner as in Example 1 except that the amount of 1-hexene was changed from 3.83 mmol to 5.75 mmol, and allyl glycidyl ether was changed to maleic anhydride. The result of the synthesis is shown in Table 1.

Example 5

Epoxy-modified Polymer (E) was obtained in the same manner as in Example 1 except that ETD was changed to tricyclo[4.3.0.1$^{2,5}$]-3,7-decadiene (i.e., dicyclo-pentadiene; hereinafter referred to as "DCP"), and the amounts of allyl glycidyl ether and dicumyl peroxide were changed to from 30 parts by weight to 100 parts by weight and from 3.0 parts by weight to 10 parts by weight, respectively. The result of the synthesis is shown in Table 1.

Example 6

Epoxy-modified Polymer (F) was obtained in the same manner as in Example 1 except that the amount of 1-hexene was changed from 3.83 mmol to 5.75 mmol, ETD was changed to DCP, and the amounts of allyl glycidyl ether and dicumyl peroxide were changed to from 30 parts by weight to 100 parts by weight and from 3.0 parts by weight to 10 parts by weight, respectively. The result of the synthesis is shown in Table 1.

Example 7

Maleic anhydride-modified Polymer (G) was obtained in the same manner as in Example 1 except that ETD was changed to DCP, 30 parts by weight of allyl glycidyl ether were changed to 100 parts by weight of maleic anhydride, and the amount of dicumyl peroxide was changed from 3.0 parts by weight to 10 parts by weight. The result of the synthesis is shown in Table 1.

Example 8

Maleic anhydride-modified Polymer (H) was obtained in the same manner as in Example 1 except that the amount of 1-hexene was changed from 3.83 mmol to 5.75 mmol, ETD was changed to DCP, 30 parts by weight of allyl glycidyl ether were changed to 100 parts by weight of maleic anhydride, and the amount of dicumyl peroxide was changed from 3.0 parts by weight to 10 parts by weight. The result of the synthesis is shown in Table 1.

Example 9

Epoxy-modified Polymer (I) was obtained in the same manner as in Example 1 except that ETD was changed to 1,4-methano-1,4,4a,9a-tetrahydrofluorene (hereinafter referred to as "MTF"), and the amount of allyl glycidyl ether was changed to from 30 parts by weight to 50 parts by weight. The result of the synthesis is shown in Table 1.

Example 10

Epoxy-modified Polymer (J) was obtained in the same manner as in Example 1 except that the amount of 1-hexene was changed from 3.83 mmol to 5.75 mmol, ETD was changed to MTF, and the amount of allyl glycidyl ether was changed to from 30 parts by weight to 50 parts by weight. The result of the synthesis is shown in Table 1.

Example 11

Maleic anhydride-modified Polymer (K) was obtained in the same manner as in Example 1 except that ETD was changed to MTF, and 30 parts by weight of allyl glycidyl ether were changed to 50 parts by weight of maleic anhydride. The result of the synthesis is shown in Table 1.

Example 12

Maleic anhydride-modified Polymer (L) was obtained in the same manner as in Example 1 except that the amount of 1-hexene was changed from 3.83 mmol to 5.75 mmol, ETD was changed to MTF, and 30 parts by weight of allyl glycidyl ether were changed to 50 parts by weight of maleic anhydride. The result of the synthesis is shown in Table 1.

TABLE 1

| | Polymer comp'n (wt. %) | Polymerization method | Hydrogenation rate of main chain (%) | Hydrogenation rate of nucleus (%) | Tg (° C.) | Molecular weight after hydrog'n | | Modifying group | Modification rate (%) | Tg (° C.) | Molecular weight after modif. | | Code No. |
|---|---|---|---|---|---|---|---|---|---|---|---|---|---|
| | | | | | | $Mn \times 10^4$ | $Mw \times 10^4$ | | | | $Mn \times 10^4$ | $Mw \times 10^4$ | |
| Ex. 1 | ETD (100) | Ring-opening | ≧99 | — | 138 | 1.85 | 3.16 | Epoxy | 17 | 164 | 1.75 | 2.99 | A |
| Ex. 2 | ETD (100) | Ring-opening | ≧99 | — | 132 | 0.81 | 1.34 | Epoxy | 24 | 164 | 0.70 | 1.28 | B |
| Ex. 3 | ETD (100) | Ring-opening | ≧99 | — | 138 | 1.85 | 3.16 | Maleic | 16 | 159 | 1.91 | 3.22 | C |
| Ex. 4 | ETD (100) | Ring-opening | ≧99 | — | 132 | 0.81 | 1.34 | Maleic | 23 | 161 | 0.98 | 1.69 | D |
| Ex. 5 | DCP (100) | Ring-opening | ≧99 | — | 94 | 1.66 | 2.81 | Epoxy | 19 | 122 | 1.51 | 2.66 | E |
| Ex. 6 | DCP (100) | Ring-opening | ≧99 | — | 87 | 0.69 | 1.24 | Epoxy | 30 | 132 | 0.50 | 0.91 | F |
| Ex. 7 | DCP (100) | Ring-opening | ≧99 | — | 94 | 1.66 | 2.81 | Maleic | 19 | 119 | 1.80 | 3.03 | G |
| Ex. 8 | DCP (100) | Ring-opening | ≧99 | — | 87 | 0.69 | 1.24 | Maleic | 28 | 126 | 0.96 | 1.51 | H |
| Ex. 9 | MTF (100) | Ring-opening | ≧99 | ≈0 | 135 | 1.75 | 2.91 | Epoxy | 21 | 161 | 1.32 | 2.18 | I |
| Ex. 10 | MTF (100) | Ring-opening | ≧99 | ≈0 | 128 | 0.79 | 1.43 | Epoxy | 28 | 163 | 0.55 | 0.95 | J |
| Ex. 11 | MTF (100) | Ring-opening | ≧99 | ≈0 | 135 | 1.75 | 2.91 | Maleic | 19 | 154 | 1.68 | 2.79 | K |
| Ex. 12 | MTF (100) | Ring-opening | ≧99 | ≈0 | 128 | 0.79 | 1.43 | Maleic | 23 | 154 | 0.85 | 1.54 | L |

Comparative Example 1

An unmodified hydrogenated product was synthesized in the same manner as in Example 1. The thus-obtained product is referred to as Polymer (M). The result of the synthesis is shown in Table 2.

Comparative Example 2

Epoxy-modified Polymer (N) was obtained in the same manner as in Example 1 except that the amount of allyl glycidyl ether was changed from 30 parts by weight to 3 parts by weight. The result of the synthesis is shown in Table 2.

Comparative Example 3

Maleic anhydride-modified Polymer (O) was obtained in the same manner as in Example 1 except that 30 parts by weight of allyl glycidyl ether were changed from to 3 parts by weight maleic anhydride. The result of the synthesis is shown in Table 2.

Comparative Example 4

An unmodified hydrogenated product was synthesized in the same manner as in Example 5. The thus-obtained product is referred to as Polymer (P). The result of the synthesis is shown in Table 2.

Comparative Example 5

Epoxy-modified Polymer (Q) was obtained in the same manner as in Example 5 except that the amounts of allyl glycidyl ether and dicumyl peroxide were changed from 100 parts by weight to 15 parts by weight and from 10 parts by weight to 1. 0 part by weight, respectively. The result of the synthesis is shown in Table 2.

Comparative Example 6

Maleic anhydride-modified Polymer (R) was obtained in the same manner as in Example 5 except that the amounts of maleic anhydride and dicumyl peroxide were changed from 100 parts by weight to 15 parts by weight and from 10 parts by weight to 1.0 part by weight, respectively. The result of the synthesis is shown in Table 2.

Comparative Example 7

An unmodified hydrogenated product was synthesized in the same manner as in Example 9. The thus-obtained product is referred to as Polymer (S). The result of the synthesis is shown in Table 2.

Comparative Example 8

Epoxy-modified Polymer (T) was obtained in the same manner as in Example 9 except that the amounts of allyl glycidyl ether and dicumyl peroxide were changed from 50 parts by weight to 10 parts by weight and from 3.0 parts by weight to 1.0 part by weight, respectively. The result of the synthesis is shown in Table 2.

Comparative Example 9

Maleic anhydride-modified Polymer (U) was obtained in the same manner as in Example 11 except that the amounts of maleic anhydride and dicumyl peroxide were changed from 50 parts by weight to 10 parts by weight and from 3.0 parts by weight to 1.0 part by weight, respectively. The result of the synthesis is shown in Table 2.

Comparative Example 10

An unmodified hydrogenated product was synthesized in the same manner as in Example 1 except that the amount of 1-hexene was changed from 3.83 mmol to 2.30 mmol. The thus-obtained product is referred to as Polymer (V). The result of the synthesis is shown in Table 2.

TABLE 2

| | Polymer comp'n (wt. %) | Polymerization method | Hydrogenation rate of main chain (%) | Hydrogenation rate of nucleus (%) | Tg (° C.) | Molecular weight after hydrog'n Mn × 10⁴ | Molecular weight after hydrog'n Mw × 10⁴ | Modifying group | Modification rate (%) | Tg (° C.) | Molecular weight after modif. Mn × 10⁴ | Molecular weight after modif. Mw × 10⁴ | Code No. |
|---|---|---|---|---|---|---|---|---|---|---|---|---|---|
| Comp. Ex. 1 | ETD (100) | Ring-opening | ≧99 | — | 138 | 1.85 | 3.16 | — | — | — | — | — | M |
| Comp. Ex. 2 | ETD (100) | Ring-opening | ≧99 | — | 138 | 1.85 | 3.16 | Epoxy | 5 | 150 | 1.80 | 3.10 | N |
| Comp. Ex. 3 | ETD (100) | Ring-opening | ≧99 | — | 138 | 1.85 | 3.16 | Maleic | 6 | 151 | 1.81 | 3.15 | O |
| Comp. Ex. 4 | DCP (100) | Ring-opening | ≧99 | — | 94 | 1.66 | 2.81 | — | — | — | — | — | P |
| Comp. Ex. 5 | DCP (100) | Ring-opening | ≧99 | — | 94 | 1.66 | 2.81 | Epoxy | 7 | 115 | 1.58 | 2.77 | Q |
| Comp. Ex. 6 | DCP (100) | Ring-opening | ≧99 | — | 94 | 1.66 | 2.18 | Maleic | 7 | 109 | 1.70 | 2.98 | R |
| Comp. Ex. 7 | MTF (100) | Ring-opening | ≧99 | ≈0 | 135 | 1.75 | 2.91 | — | — | — | — | — | S |
| Comp. Ex. 8 | MTF (100) | Ring-opening | ≧99 | ≈0 | 135 | 1.75 | 2.91 | Epoxy | 5 | 145 | 1.60 | 2.71 | T |
| Comp. Ex. 9 | MTF (100) | Ring-opening | ≧99 | ≈0 | 135 | 1.75 | 2.91 | Maleic | 4 | 143 | 1.70 | 2.85 | U |
| Comp. Ex. 10 | ETD (100) | Ring-opening | ≧99 | — | 140 | 2.85 | 5.78 | — | — | — | — | — | V |

Examples 13 to 24

The individual modified polymers obtained in Examples 1 to 12 and various kinds of components were blended so as to give their corresponding compositions shown in Table 3, and the thus-obtained compositions were separately dissolved in toluene to give a solids concentration of 50 to 60 wt. %, thereby preparing respective varnishes. After these solutions were left at rest for 30 minutes, uniformity of the solutions was visually evaluated to rank them in accordance with the following standard:

Uniformity of solution:
 ○: The solution was completely uniform; and
 X: The solution underwent phase separation.

An E glass cloth 10 cm wide, 10 cm long and about 0.5 mm thick was dipped for 10 seconds in each of these solutions, slowly pulled up and then left to stand for 1 minute. Only solids in the resin-impregnated glass cloth thus obtained were dissolved again in toluene, and the resultant solution was poured into a large amount of isopropyl acetate to solidify a modified polymer portion. The solidified polymer was collected by filtration. On the other hand, the filtrate was poured into a large amount of methanol to collect a flame retardant portion in the same manner as described above.

These portions were separately dried for 48 hours at 70° C. under 1 Torr to measure their weights. The uniformity of impregnation was evaluated on the basis of a difference between a weight ratio of the two components at this time and a weight ratio of the two components in a state of the varnish to rank it in the following standard:

Uniformity of Impregnation:
 ⊚: The difference in weight ratio was lower than 2%;
 ○: The difference in weight ratio was not lower than 2%, but lower than 5%;
 Δ: The difference in weight ratio was not lower than 5%, but lower than 10%; and
 X: The difference in weight ratio was not lower than 10%.

Further, an E glass cloth was dipped in and impregnated with each of the above solutions and then dried in an air oven to prepare a curable composite material (prepreg). The weight of the base material in the prepreg was controlled to 40% based on the weight of the prepreg. As needed, plural sheets of the thus-produced prepreg were stacked on one another so as to give a thickness of 0.8 mm after molding, and a copper foil 35 μm thick was placed on both sides thereof. The thus-obtained laminate was molded and cured by a hot pressing machine to obtain a resin laminate.

Various physical properties of the resin laminates obtained in such a manner were measured. As a result, all the resin laminates exhibited good dielectric constant and copper foil peeling strength and had flame retardancy of V-0.

TABLE 3

| | Polymer (part) | Peroxide (part) | Cross-linking aid (part) | Flame retardant (part) | Hardener (part) | Solids conc'n (%) | Uniformity Solution | Uniformity Impregnation | Dielec. const. ε | Copper foil peeling strength (kg/cm²) |
|---|---|---|---|---|---|---|---|---|---|---|
| Ex. 13 | A (60) | a (1) | TAIC (5) | b (40) | Imidazole (1) | 50 | ○ | ⊚ | 3.05 | 2.0 |
| Ex. 14 | B (60) | a (1) | TAIC (5) | b (40) | Imidazole (1) | 60 | ○ | ⊚ | 3.10 | 2.3 |
| Ex. 15 | C (60) | a (1) | TAIC (5) | b (40) | Imidazole (1) | 50 | ○ | ⊚ | 3.00 | 1.9 |
| Ex. 16 | D (60) | a (1) | TAIC (5) | b (40) | Imidazole (1) | 60 | ○ | ⊚ | 3.05 | 2.1 |
| Ex. 17 | E (60) | a (1) | TAIC (5) | b (40) | Imidazole (1) | 50 | ○ | ⊚ | 3.00 | 2.0 |

TABLE 3-continued

|  | Polymer (part) | Peroxide (part) | Cross-linking aid (part) | Flame retardant (part) | Hardener (part) | Solids conc'n (%) | Uniformity Solution | Uniformity Impregnation | Dielec. const. ε | Copper foil peeling strength (kg/cm²) |
|---|---|---|---|---|---|---|---|---|---|---|
| Ex. 18 | F (60) | a (1) | TAIC (5) | b (40) | Imidazole (1) | 60 | ○ | ⊚ | 3.15 | 2.6 |
| Ex. 19 | G (60) | a (1) | TAIC (5) | b (40) | Imidazole (1) | 50 | ○ | ⊚ | 3.00 | 2.1 |
| Ex. 20 | H (60) | a (1) | TAIC (5) | b (40) | Imidazole (1) | 60 | ○ | ⊚ | 3.10 | 2.5 |
| Ex. 21 | I (60) | a (1) | TAIC (5) | b (40) | Imidazole (1) | 50 | ○ | ⊚ | 3.05 | 2.1 |
| Ex. 22 | G (60) | a (1) | TAIC (5) | b (40) | Imidazole (1) | 60 | ○ | ⊚ | 3.05 | 2.3 |
| Ex. 23 | K (60) | a (1) | TAIC (5) | b (40) | Imidazole (1) | 50 | ○ | ⊚ | 3.00 | 1.8 |
| Ex. 24 | L (60) | a (1) | TAIC (5) | b (40) | Imidazole (1) | 60 | ○ | ⊚ | 3.05 | 2.2 |

(Note)

Peroxide: a = 2,5-Dimethyl-2,5-di(t-butyl peroxy)hexyne-3;

Crosslinking aid: TAIC=Triallyl isocyanurate;

Flame retardant: b=Brominated bisphenol A type epoxy resin (AER 8010, product of Asahi-CIBA Limited; Br content: 5 wt. %);

Hardener: Imidazole=2-Ethyl-4-methylimidazole.

It is understood from Table 3 that even when the modified polymers (Examples 13 to 24) according to the present invention are prepared into solutions at a solids concentration of 50 to 60 wt. %, the compounding additives such as the crosslinking agent, crosslinking aid, flame retardant and hardener can be uniformly dispersed therein, and the resultant moldings are excellent in both dielectric constant and copper foil peeling strength.

Comparative Examples 11 to 20

Respective experiments were conducted in the same manner as in Examples 13 to 24 except that the modified or unmodified polymers obtained in Comparative Examples 1 to 10 were used in place of the modified polymers obtained in Examples 1 to 12. The results are shown in Table 4.

It is understood from the results shown in Table 4 that the unmodified polymers and the modified polymer low in modification rate exhibit insufficient copper foil peeling strength.

Example 25

Epoxy-modified Polymer (a) was obtained in the same manner as in Example 1 except that the amount of 1-hexene was changed from 3.83 mmol to 1.86 mmol. The result of the synthesis is shown in Table 5.

Example 26

Maleic anhydride-modified Polymer (b) was obtained in the same manner as in Example 25 except that 30 parts by weight of allyl glycidyl ether were changed to 30 parts by weight of maleic anhydride. The result of the synthesis is shown in Table 5.

Example 27

Epoxy-modified Polymer (c) was obtained in the same manner as in Example 25 except that ETD was changed to DCP, and the amounts of allyl glycidyl ether and dicumyl peroxide were changed from 30 parts by weight to 100 parts

TABLE 4

|  | Polymer (part) | Peroxide (part) | Cross-linking aid (part) | Flame retardant (part) | Hardener (part) | Solids conc'n (%) | Uniformity Solution | Uniformity Impregnation | Dielec. const. ε | Copper foil peeling strength (kg/cm²) |
|---|---|---|---|---|---|---|---|---|---|---|
| Comp. Ex. 11 | M (60) | a (1) | TAIC (5) | b (40) | Imidazole (1) | 50 | ○ | ⊚ | 2.90 | 0.6 |
| Comp. Ex. 12 | N (60) | a (1) | TAIC (5) | b (40) | Imidazole (1) | 50 | ○ | ⊚ | 2.95 | 1.0 |
| Comp. Ex. 13 | O (60) | a (1) | TAIC (5) | b (40) | Imidazole (1) | 50 | ○ | ⊚ | 2.95 | 1.0 |
| Comp. Ex. 14 | P (60) | a (1) | TAIC (5) | b (40) | Imidazole (1) | 50 | ○ | ⊚ | 2.90 | 0.6 |
| Comp. Ex. 15 | Q (60) | a (1) | TAIC (5) | b (40) | Imidazole (1) | 50 | ○ | ⊚ | 2.95 | 1.0 |
| Comp. Ex. 16 | R (60) | a (1) | TAIC (5) | b (40) | Imidazole (1) | 50 | ○ | ⊚ | 2.95 | 1.0 |
| Comp. Ex. 17 | S (60) | a (1) | TAIC (5) | b (40) | Imidazole (1) | 50 | ○ | ⊚ | 2.90 | 0.6 |
| Comp. Ex. 18 | T (60) | a (1) | TAIC (5) | b (40) | Imidazole (1) | 50 | ○ | ⊚ | 2.95 | 1.0 |
| Comp. Ex. 19 | U (60) | a (1) | TAIC (5) | b (40) | Imidazole (1) | 50 | ○ | ⊚ | 2.95 | 1.0 |
| Comp. Ex. 20 | V (60) | a (1) | TAIC (5) | b (40) | Imidazole (1) | 50 | x | x | 2.90 | 0.6 | by weight and from 3.0 parts by weight to 10 parts by weight, respectively. The result of the synthesis is shown in Table 5.

Example 28

Maleic anhydride-modified Polymer (d). was obtained in the same manner as in Example 27 except that allyl glycidyl ether was changed to maleic anhydride. The result of the synthesis is shown in Table 5.

Example 29

Epoxy-modified Polymer (e) was obtained in the same manner as in Example 25 except that ETD was changed to MTF, and the amount of allyl glycidyl ether was changed from 30 parts by weight to 50 parts by weight. The result of the synthesis is shown in Table 5.

Example 30

Maleic anhydride-modified Polymer (f) was obtained in the same manner as in Example 29 except that allyl glycidyl ether was changed to maleic anhydride. The result of the synthesis is shown in Table 5.

Comparative Example 21

An unmodified hydrogenated product was synthesized in the same manner as in Example 25. The thus-obtained product is referred to as Polymer (g). The result of the synthesis is shown in Table 5.

Comparative Example 22

Epoxy-modified Polymer (h) was obtained in the same manner as in Example 25 except that the amount of allyl glycidyl ether was changed from 30 parts by weight to 3.0 parts by weight. The result of the synthesis is shown in Table 5.

Comparative Example 23

Maleic anhydride-modified (i) was obtained in the same manner as in Example 26 except that the amount of maleic anhydride was changed from 30 parts by weight to 3.0 parts by weight. The result of the synthesis is shown in Table 5.

Comparative Example 24

An unmodified hydrogenated product was synthesized in the same manner as in Example 27. The thus-obtained product is referred to as Polymer (j). The result of the synthesis is shown in Table 5.

Comparative Example 25

Epoxy-modified Polymer (k) was obtained in the same manner as in Example 27 except that the amount of allyl glycidyl ether was changed from 100 parts by weight to 15 parts by weight. The result of the synthesis is shown in Table 5.

Comparative Example 26

Maleic anhydride-modified (1) was obtained in the same manner as in Example 28 except that the amount of maleic anhydride was changed from 100 parts by weight to 15 parts by weight. The result of the synthesis is shown in Table 5.

Comparative Example 27

An unmodified hydrogenated product was synthesized in the same manner as in Example 29. The thus-obtained product is referred to as Polymer (m). The result of the synthesis is shown in Table 5.

Comparative Example 28

Epoxy-modified Polymer (n) was obtained in the same manner as in Example 29 except that the amount of allyl glycidyl ether was changed from 50 parts by weight to 10 parts by weight. The result of the synthesis is shown in Table 5.

Comparative Example 29

Maleic anhydride-modified (o) was obtained in the same manner as in Example 30 except that the amount of maleic anhydride was changed from 50 parts by weight to 10 parts by weight. The result of the synthesis is shown in Table 5.

TABLE 5

| | Polymer comp'n (wt. %) | Polymerization method | Hydrogenation rate of main chain (%) | Hydrogenation rate of nucleus (%) | Tg (° C.) | Molecular weight after hydrog'n | | Modifying group | Modification rate (%) | Tg (° C.) | Molecular weight after modif. | | Code No. |
|---|---|---|---|---|---|---|---|---|---|---|---|---|---|
| | | | | | | Mn × 10$^4$ | Mw × 10$^4$ | | | | Mn × 10$^4$ | Mw × 10$^4$ | |
| Ex. 25 | ETD (100) | Ring-opening | ≧99 | — | 140 | 2.45 | 4.54 | Epoxy | 17 | 164 | 2.40 | 4.41 | a |
| Ex. 26 | ETD (100) | Ring-opening | ≧99 | — | 140 | 2.45 | 4.54 | Maleic | 26 | 161 | 2.60 | 4.68 | b |
| Ex. 27 | DCP (100) | Ring-opening | ≧99 | — | 95 | 2.11 | 4.45 | Epoxy | 15 | 122 | 2.06 | 4.31 | c |
| Ex. 28 | DCP (100) | Ring-opening | ≧99 | — | 95 | 2.11 | 4.45 | Maleic | 16 | 119 | 2.24 | 4.60 | d |
| Ex. 29 | MTF (100) | Ring-opening | ≧99 | ≈0 | 135 | 2.20 | 4.43 | Epoxy | 21 | 161 | 2.08 | 4.30 | e |
| Ex. 30 | MTF (100) | Ring-opening | ≧99 | ≈0 | 135 | 2.20 | 4.43 | Maleic | 19 | 154 | 2.28 | 4.61 | f |
| Comp. Ex. 21 | ETD (100) | Ring-opening | ≧99 | — | 140 | 2.45 | 4.54 | — | — | — | — | — | g |
| Comp. Ex. 22 | ETD (100) | Ring-opening | ≧99 | — | 140 | 2.45 | 4.54 | Epoxy | 5 | 151 | 2.40 | 4.46 | h |
| Comp. Ex. 23 | ETD (100) | Ring-opening | ≧99 | — | 140 | 2.45 | 4.54 | Maleic | 5 | 144 | 2.51 | 4.57 | i |
| Comp. | DCP | Ring- | ≧99 | — | 95 | 2.11 | 4.45 | — | — | — | — | — | j |

TABLE 5-continued

| | Polymer comp'n (wt. %) | Polymer- ization method | Hydrogena- tion rate of main chain (%) | Hydrogena- tion rate of nucleus (%) | Tg (° C.) | Molecular weight after hydrog'n Mn × 10⁴ | Mw × 10⁴ | Modify- ing group | Modifi- cation rate (%) | Tg (° C.) | Molecular weight after modif. Mn × 10⁴ | Mw × 10⁴ | Code No. |
|---|---|---|---|---|---|---|---|---|---|---|---|---|---|
| Ex. 24 | (100) | opening | | | | | | | | | | | |
| Comp. Ex. 25 | DCP (100) | Ring- opening | ≧99 | — | 95 | 2.11 | 4.45 | Epoxy | 6 | 115 | 2.08 | 4.37 | k |
| Comp. Ex. 26 | DCP (100) | Ring- opening | ≧99 | — | 95 | 2.11 | 4.45 | Maleic | 7 | 109 | 2.15 | 4.50 | l |
| Comp. Ex. 27 | MTF (100) | Ring- opening | ≧99 | ≈0 | 135 | 2.20 | 4.43 | — | — | — | — | — | m |
| Comp. Ex. 28 | MTF (100) | Ring- opening | ≧99 | ≈0 | 135 | 2.20 | 4.43 | Epoxy | 4 | 145 | 2.16 | 4.35 | n |
| Comp. Ex. 29 | MTF (100) | Ring- opening | ≧99 | ≈0 | 135 | 2.20 | 4.43 | Maleic | 5 | 142 | 2.21 | 4.47 | o |

Examples 31 to 36

Thirty parts by weight of each of the modified polymers obtained in Examples 25 to 30 and 1.2 parts by weight of bisazidobenzal(4-methyl)cyclohexanone were dissolved in 100 parts by weight of xylene. Each composition was provided as a uniform solution without forming any precipitate.

This uniform solution was then coated on a silicon wafer, in which an aluminum wiring had been formed on an $SiO_2$ film 4000 Å thick, by a spin coating process, and the thus-coated solution was prebaked at 90° C. for 60 seconds, thereby forming a coating film 3.3 μm thick on the aluminum wiring. Each sample thus obtained was cured at 250° C. for 3 hours under nitrogen, thereby forming an overcoat 3 μm thick to evaluate it as to dielectric constant, adhesion property, soldering heat resistance and durability (heat resistance and moisture resistance). The results are shown in Table 6.

Comparative Examples 30 to 38

Respective experiments were conducted in the same manner as in Examples 25 to 30 except that the modified or unmodified polymers obtained in Comparative Examples 21 to 29 were used in place of the modified polymers obtained in Examples 25 to 30. The results are shown in Table 6.

TABLE 6

| | Soldering heat resistance | Adhesion property to alumin. wiring- formed silicon wafer | Change in metal layer after durability test | Dielec. loss tangent | Dielec. const. (1 MHz) | Code No. |
|---|---|---|---|---|---|---|
| Ex. 31 | Good | 100/100 | Not changed | 0.0009 | 2.3 | a |
| Ex. 32 | Good | 100/100 | Not changed | 0.0009 | 2.3 | b |
| Ex. 33 | Good | 100/100 | Not changed | 0.0007 | 2.2 | c |
| Ex. 34 | Good | 100/100 | Not changed | 0.0007 | 2.2 | d |
| Ex. 35 | Good | 100/100 | Not changed | 0.0009 | 2.3 | e |
| Ex. 36 | Good | 100/100 | Not changed | 0.0009 | 2.3 | f |
| Comp. Ex. 30 | Poor | 5/100 | Corroded and tarnished | 0.0007 | 2.2 | g |
| Comp. Ex. 31 | Partially deformed | 20/100 | Not changed | 0.0009 | 2.3 | h |
| Comp. Ex. 32 | Partially deformed | 20/100 | Not changed | 0.0009 | 2.3 | i |
| Comp. Ex. 33 | Poor | 3/100 | Corroded and tarnished | 0.0007 | 2.2 | j |
| Comp. Ex. 34 | Partially deformed | 20/100 | Not changed | 0.0007 | 2.2 | k |
| Comp. Ex. 35 | Partially deformed | 20/100 | Not changed | 0.0007 | 2.2 | l |
| Comp. Ex. 36 | Poor | 5/100 | Corroded and tarnished | 0.0007 | 2.2 | m |
| Comp. Ex. 37 | Partially deformed | 20/100 | Not changed | 0.0009 | 2.3 | n |
| Comp. Ex. 38 | Partially deformed | 20/100 | Not changed | 0.0009 | 2.3 | o |

It is understood from the results shown in Table 6 that when the modified polymers according to the present invention are used, overcoats (or interlayer insulating films) excellent in soldering heat resistance, adhesion property, durability, electrical properties and the like can be obtained.

INDUSTRIAL APPLICABILITY

According to the present invention, there are provided modified thermoplastic norbornene polymers excellent in electrical properties such as dielectric constant and dielectric loss tangent and also in adhesion property to other materials such as metals and silicon wafers, a production process thereof, crosslinking polymer compositions comprising such a modified thermoplastic norbornene polymer and a crosslinking agent, moldings thereof, and sheets, prepregs, laminates and the like using such a composition. The modified thermoplastic norbornene polymers and compositions comprising such a polymer according to the present invention can be applied to a wide variety of fields such as circuits boards, interlayer insulating films, semiconductor devices and electronic parts in precision apparatus such as electronic computers and communication machines.

What is claimed is:

1. A crosslinking polymer composition comprising:
    100 parts by weight of a modified thermoplastic norbornene polymer obtained by graft-modifying a thermoplastic norbornene polymer selected from a ring-opening polymer of a norbornene monomer and a hydrogenated product thereof with at least one unsaturated compound selected from the group consisting of unsaturated epoxy compounds, unsaturated dicarboxylic acids and unsaturated dicarboxylic acid anhydrides, and having a degree of graft modification of 15 to 50 mol % and a number average molecular weight (Mn) of 500 to 20,000,
    0.001 to 30 parts by weight of a crosslinking agent, and
    10 to 140 parts by weight of a flame retardant.

2. The crosslinking polymer composition according to claim 1, wherein the crosslinking agent is selected from ① an organic peroxide, ② a crosslinking agent capable of exhibiting its effect by heat or ③ a crosslinking agent capable of exhibiting its effect by light.

3. A prepreg comprising a reinforcing base material impregnated with the crosslinking polymer composition according to claim 2.

4. The crosslinking polymer composition according to claim 1, which further comprises a crosslinking aid.

5. A prepreg comprising a reinforcing base material impregnated with the crosslinking polymer composition according to claim 4.

6. A molding obtained by molding the crosslinking polymer composition according to claim 1.

7. A laminate, comprising a layer formed of the crosslinking polymer composition according to claim 1 laminated on a metal layer.

8. A prepreg comprising a reinforcing base material impregnated with the crosslinking polymer composition according to claim 1.

9. The prepreg according to claim 8, in which the reinforcing base material is a material selected from a group consisting of paper base materials, glass base materials and synthetic resin fiber base materials.

10. The prepreg according to claim 8, in which the amount of the crosslinking polymer composition to the reinforcing base materials is 1 to 90 % by weight.

11. The crosslinking polymer composition according to claim 1, wherein the modified thermoplastic norbornene polymer is a polymer having repeating units represented by the formula (A):

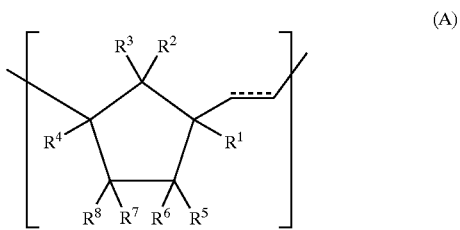

wherein $R^1$ to $R^8$ are independently a hydrogen atom, hydrocarbon group, halogen atom, alkoxy group, ester group, cyano group, amide group, imide group, silyl group or hydrocarbon group substituted by a polar group, with the proviso that at least two of $R^5$ to $R^8$ may be bonded to each other to form a monocycle or polycycle, the monocycle or polycycle may have carbon-carbon double bond(s) or be in the form of an aromatic ring, and $R^5$ and $R^6$, or $R^7$ and $R^8$ may form an alkylidene group, and ---- means either a single bond or a double bond.

12. A prepreg comprising a reinforcing base material impregnated with the crosslinking polymer composition according to claim 11.

13. The crosslinking polymer composition according to claim 1, in which the modified thermoplastic norbornene polymer has a ratio (Mw/Mn) of the weight average molecular weight (Mw) to the number average molecular weight of 4.0 or lower.

14. A prepreg comprising a reinforcing base material impregnated with the crosslinking polymer composition according to claim 13.

* * * * *